(12) United States Patent
Yoshikawa et al.

(10) Patent No.: US 12,150,326 B2
(45) Date of Patent: Nov. 19, 2024

(54) DISPLAY DEVICE AND METHOD OF MANUFACTURING DISPLAY DEVICE

(71) Applicant: SHARP KABUSHIKI KAISHA, Sakai (JP)

(72) Inventors: Hirofumi Yoshikawa, Sakai (JP); Tatsuya Ryohwa, Sakai (JP); Masumi Kubo, Sakai (JP); Takahiro Doe, Sakai (JP); Masaki Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 483 days.

(21) Appl. No.: 17/762,851

(22) PCT Filed: Oct. 2, 2019

(86) PCT No.: PCT/JP2019/038965
§ 371 (c)(1),
(2) Date: Mar. 23, 2022

(87) PCT Pub. No.: WO2021/064910
PCT Pub. Date: Apr. 8, 2021

(65) Prior Publication Data
US 2022/0344606 A1    Oct. 27, 2022

(51) Int. Cl.
*H01L 51/50* (2006.01)
*H01L 51/56* (2006.01)
*H10K 50/115* (2023.01)
*H10K 50/125* (2023.01)
*H10K 50/14* (2023.01)
*H10K 71/00* (2023.01)

(52) U.S. Cl.
CPC ......... *H10K 50/115* (2023.02); *H10K 50/125* (2023.02); *H10K 50/14* (2023.02); *H10K 71/00* (2023.02)

(58) Field of Classification Search
CPC .... H10K 50/125; H10K 50/115; H10K 50/14; H10K 71/00; H10K 59/35; H10K 85/211–215; G09F 9/30; H05B 33/12; H05B 33/14; H05B 33/22; H01L 21/02601
See application file for complete search history.

(56) References Cited

U.S. PATENT DOCUMENTS

| | | | | |
|---|---|---|---|---|
| 2004/0197884 A1* | 10/2004 | Okuda | ................ | C01G 37/02 435/174 |
| 2008/0213663 A1* | 9/2008 | Hu | ................ | H01M 4/626 252/514 |
| 2011/0038025 A1* | 2/2011 | Naitou | ................ | G11B 7/0052 252/301.36 |
| 2016/0170262 A1* | 6/2016 | Saneto | ............. | G02F 1/133603 349/71 |
| 2021/0288281 A1* | 9/2021 | Li | .............. | H10K 50/16 |

FOREIGN PATENT DOCUMENTS

JP    2012-234748 A    11/2012

* cited by examiner

Primary Examiner — Shahed Ahmed
Assistant Examiner — Rhys Poniente Sheker
(74) Attorney, Agent, or Firm — ScienBiziP, P.C.

(57) ABSTRACT

A display device includes: ferritin encaging a first quantum dot and modified with a first peptide bound to a first pixel electrode; and ferritin encaging a second quantum dot and modified with a second peptide bound to a second pixel electrode. A first metal material and a second metal material are of different types.

12 Claims, 24 Drawing Sheets

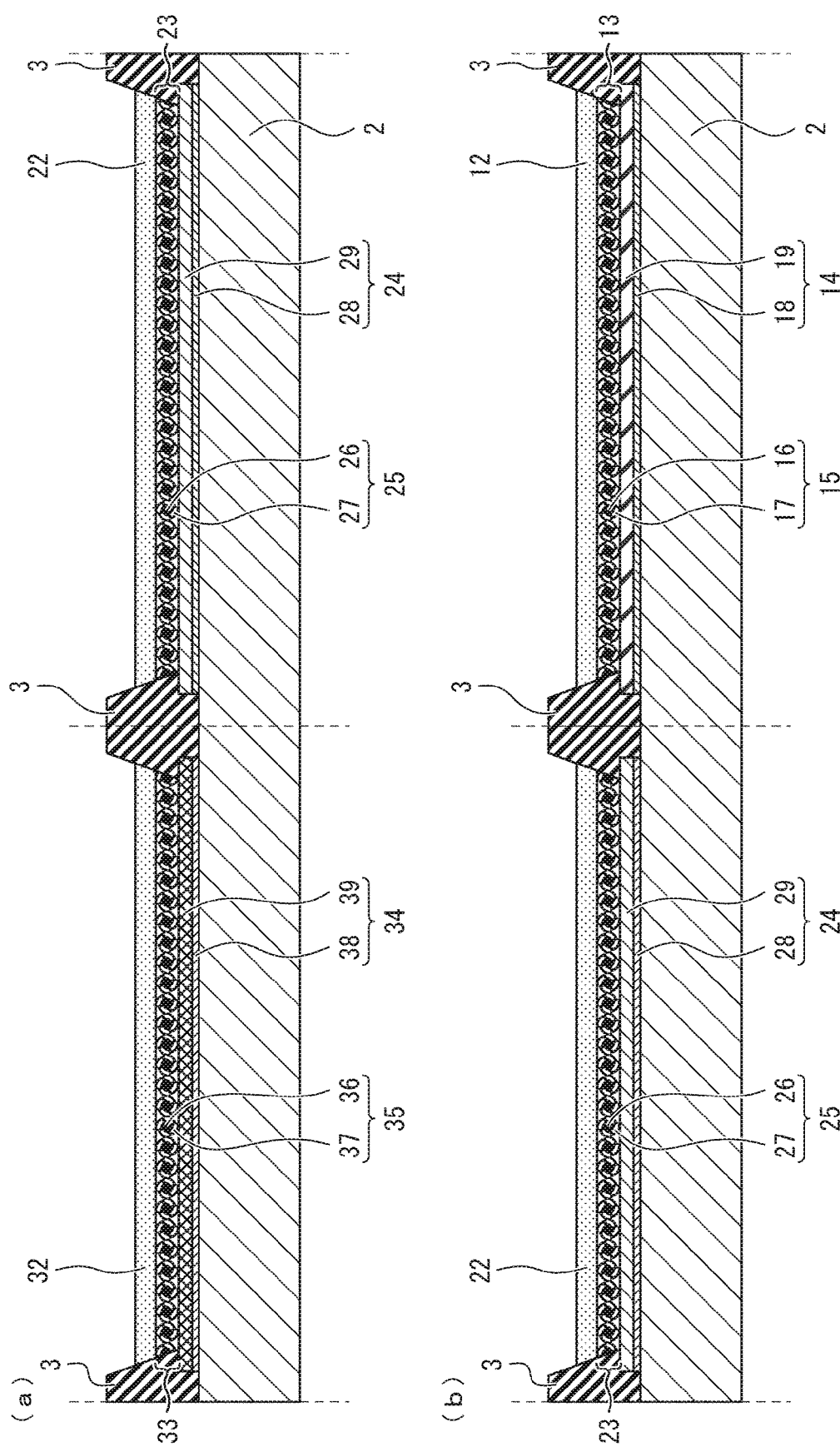

DISPLAY DEVICE AND METHOD OF MANUFACTURING DISPLAY DEVICE

TECHNICAL FIELD

The disclosure relates to display devices and methods of manufacturing display devices.

BACKGROUND ART

Some techniques are known of forming different light-emitting layers by coating with different materials in the manufacture of a QLED (quantum-dot light-emitting diode) display device. Of particular interest is technology called liquid coating, such as inkjet technology, for its high productivity and other advantages.

In known liquid coating, quantum dot material is applied after forming a partition wall. Two adjacent light-emitting layers are typically separated by this partition wall in known liquid coating (see Patent Literature 1).

CITATION LIST

Patent Literature

Patent Literature 1: Japanese Unexamined Patent Application Publication, Tokukai, No. 2012-234748 (Publication Date: Nov. 29, 2012)

SUMMARY

Technical Problem

The provision of a partition wall reduces the area of the light-emitting layer. A larger partition wall will also lead to a smaller area of the light-emitting layer. These factors lower the aperture ratio of the display device, hence a low luminance of the display device, which is undesirable.

The disclosure, in an aspect thereof, has an object to provide a high luminance display device and a method of manufacturing such a display device.

Solution to Problem

The disclosure, in an aspect thereof, is directed to a display device including: a first pixel electrode for a first pixel that emits first-color light; a second pixel electrode for a second pixel that emits second-color light having a different wavelength than the first-color light; a common electrode common to the first pixel and the second pixel; a first light-emitting layer between the first pixel electrode and the common electrode; and a second light-emitting layer between the second pixel electrode and the common electrode, wherein the first light-emitting layer includes: a first quantum dot; and ferritin encaging the first quantum dot and modified with a first peptide bound to the first pixel electrode, the second light-emitting layer includes: a second quantum dot; and ferritin encaging the second quantum dot and modified with a second peptide bound to the second pixel electrode, and the first pixel electrode has a surface made of a first metal material, and the second pixel electrode has a surface made of a second metal material of a different type than the first metal material.

The disclosure, in an aspect thereof, is directed to a method of manufacturing a display device, the method including: the electrode forming step of forming a first pixel electrode for a first pixel that emits first-color light and a second pixel electrode for a second pixel that emits second-color light having a different wavelength than the first-color light; the first light-emitting layer forming step of forming a first light-emitting layer on the first pixel electrode; and the second light-emitting layer forming step of forming a second light-emitting layer on the second pixel electrode, wherein the first pixel electrode is formed so as to have a surface made of a first metal material, and the second pixel electrode is formed so as to have a surface made of a second metal material of a different type than the first metal material, in the electrode forming step, the first metal material is bound to a first peptide modifying ferritin encaging a first quantum dot in the first light-emitting layer forming step, and the second metal material is bound to a second peptide modifying ferritin encaging a second quantum dot in the second light-emitting layer forming step

Advantageous Effects of Invention

The disclosure, in an aspect thereof, provides a high luminance display device and a method of manufacturing such a display device.

BRIEF DESCRIPTION OF DRAWINGS

FIG. 26 is a cross-sectional view depicting the method of manufacturing a display device in accordance with Embodiment 3 of the disclosure.

DESCRIPTION OF EMBODIMENTS

Figure 1:
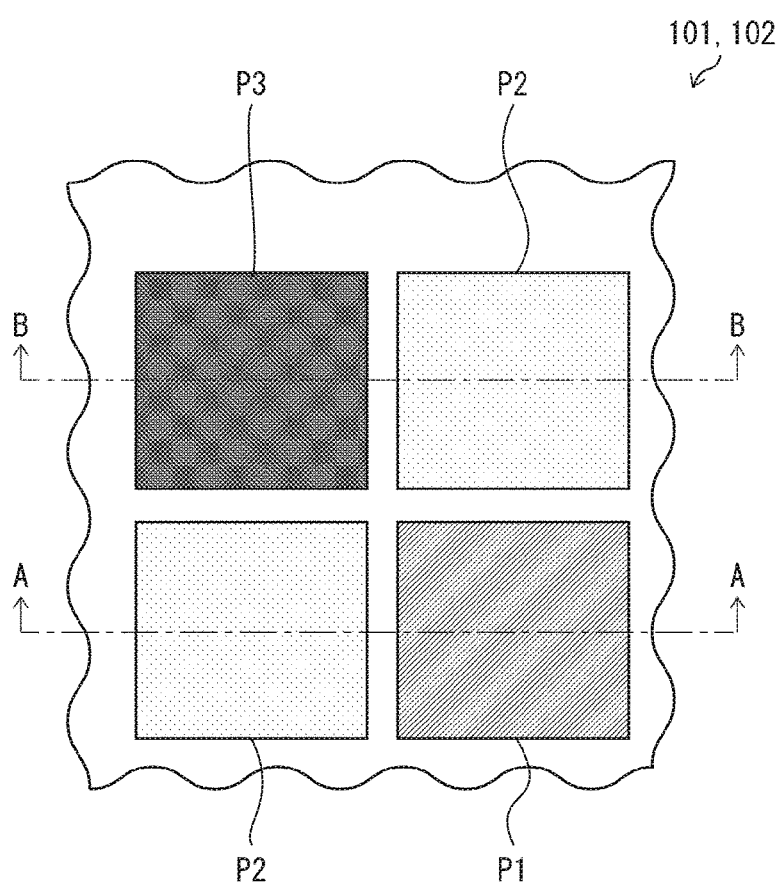
FIG. 1 is a schematic plan view of a structure of a major part of a display device constructed in accordance with all embodiments of the present invention-disclosure.

The following will describe embodiments of the disclosure. For convenience of description, those members which have the same function as previously described members will be indicated by the same reference numerals, and description thereof may not be repeated.

Embodiment 1

FIG. 1 is a schematic plan view of a structure of a major part of a display device constructed in accordance with all embodiments of the disclosure. FIG. 1 doubles as a schematic plan view of a structure of a major part of a display device 101 detailed later and a schematic plan view of a structure of a major part of a display device 102 detailed later. Both the display device 101 and the display device 102 include first pixels P1, second pixels P2, and third pixels P3. The first pixels P1 emit blue (first color) light. The second pixels P2 emit green (second color) light. The third pixels P3 emit red (third color) light. Needless to say, the blue light emitted by the first pixels P1, the green light emitted by the second pixels P2, and the red light emitted by the third pixels P3 have mutually different wavelengths.

Figure 2:
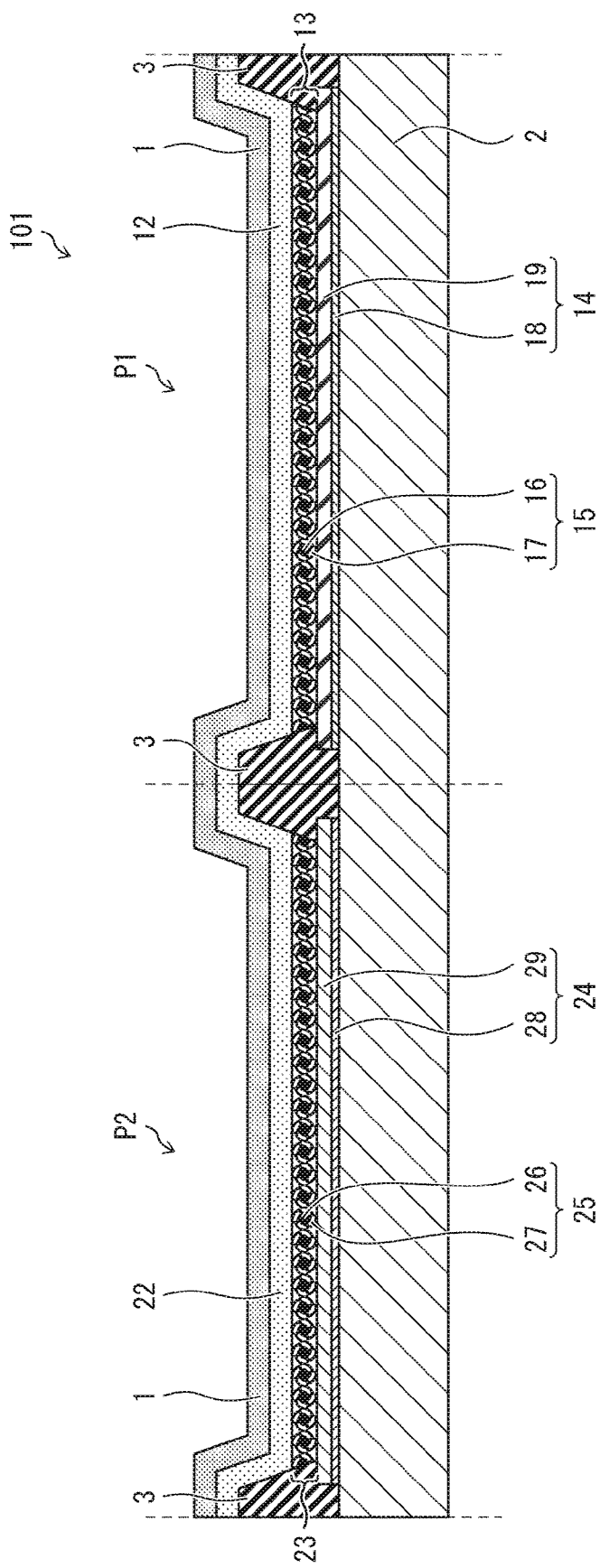
FIG. 2 is a cross-sectional view taken along line A-A shown in FIG. 1 in accordance with Embodiments 1 and 2 of the disclosure.
Figure 3:
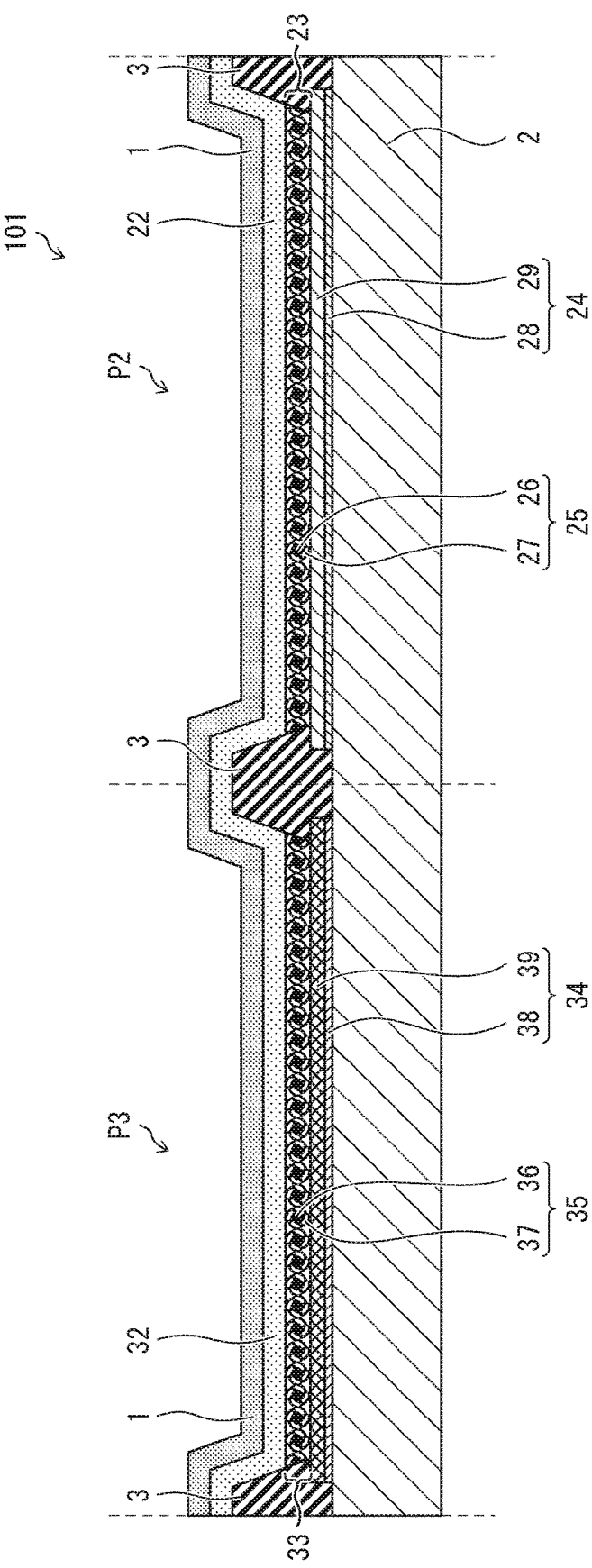
FIG. 3 is a cross-sectional view taken along line B-B shown in FIG. 1 in accordance with Embodiments 1 and 2 of the disclosure.

FIG. 2 is a cross-sectional view taken along line A-A shown in FIG. 1 in accordance with Embodiments 1 and 2 of the disclosure. FIG. 3 is a cross-sectional view taken along line B-B shown in FIG. 1 in accordance with Embodiments 1 and 2 of the disclosure. Each first pixel P1 includes a first carrier transport layer 12, a first light-emitting layer 13, and a first pixel electrode 14. Each second pixel P2 includes a second carrier transport layer 22, a second light-emitting layer 23, and a second pixel electrode 24. Each third pixel P3 includes a third carrier transport layer 32, a third light-emitting layer 33, and a third pixel electrode 34. The display device 101 in accordance with Embodiments 1 and 2 of the disclosure further includes a common electrode 1, a substrate 2, and an edge cover 3.

The "carrier transport layer" is a collective term for the publicly known electron transport layer and the publicly known hole transport layer. FIGS. 2 and 3 show a preferred example in which the common electrode 1 is a cathode, and each of the first pixel electrode 14, the second pixel electrode 24, and the third pixel electrode 34 is an anode. In this preferred example, the first carrier transport layer 12, the second carrier transport layer 22, and the third carrier transport layer 32 each correspond to an electron transport layer. In an alternative example, the common electrode 1 may be an anode, and each of the first pixel electrode 14, the second pixel electrode 24, and the third pixel electrode 34 may be a cathode. In this alternative example, the first carrier transport layer 12, the second carrier transport layer 22, and the third carrier transport layer 32 each correspond to a hole transport layer.

The first pixel electrode 14, the second pixel electrode 24, and the third pixel electrode 34 are provided on the substrate 2. The first light-emitting layer 13, the second light-emitting layer 23, and the third light-emitting layer 33 are provided respectively on the first pixel electrode 14, the second pixel electrode 24, and the third pixel electrode 34. The first carrier transport layer 12, the second carrier transport layer 22, and the third carrier transport layer 32 are provided respectively on the first light-emitting layer 13, the second light-emitting layer 23, and the third light-emitting layer 33. The common electrode 1 is provided above and across the first carrier transport layer 12, the second carrier transport layer 22, and the third carrier transport layer 32.

In other words, the first pixel P1 includes the substrate 2, the first pixel electrode 14, the first light-emitting layer 13, the first carrier transport layer 12, and the common electrode 1, all of which are stacked in this order; the second pixel P2 includes the substrate 2, the second pixel electrode 24, the second light-emitting layer 23, the second carrier transport layer 22, and the common electrode 1, all of which are stacked in this order; and the third pixel P3 includes the substrate 2, the third pixel electrode 34, the third light-emitting layer 33, the third carrier transport layer 32, and the common electrode 1, all of which are stacked in this order. The first light-emitting layer 13 is sandwiched by the first pixel electrode 14 and the common electrode 1. The first carrier transport layer 12 is sandwiched by the first light-emitting layer 13 and the common electrode 1. The second light-emitting layer 23 is sandwiched by the second pixel electrode 24 and the common electrode 1. The second carrier transport layer 22 is sandwiched by the second light-emitting layer 23 and the common electrode 1. The third light-emitting layer 33 is sandwiched by the third pixel electrode 34 and the common electrode 1. The third carrier transport layer 32 is sandwiched by the third light-emitting layer 33 and the common electrode 1.

The edge cover 3 is provided around the first pixel electrodes 14, the second pixel electrodes 24, and the third pixel electrodes 34. The edge cover 3 has openings for exposing the first pixel electrodes 14, the second pixel electrodes 24, and the third pixel electrodes 34. Light-emitting regions are delineated by regions where (i) the exposed first, second, and third pixel electrodes 14, 24, and 34, (ii) the first light-emitting layer 13, the second light-emitting layer 23, and the third light-emitting layer 33, and (iii) the common electrode 1 overlap. Electric current flows from the first pixel electrodes 14, the second pixel electrodes 24, and the third pixel electrodes 34 to the common electrode 1 in the light-emitting regions (when the first, second, and third pixel electrodes 14, 24, and 34 are anodes), so that the light-emitting regions can emit light.

The common electrode 1 is a transparent electrode. The common electrode 1 is provided correspondingly to each of the first pixel electrodes 14, the second pixel electrodes 24, and the third pixel electrodes 34, in other words, provided commonly to the first pixel electrodes 14, the second pixel electrodes 24, and the third pixel electrodes 34. The common electrode 1 may be made of, a transparent conductive member such as a Mg—Ag alloy (super thin film), ITO (indium tin oxide), or IZO (indium zinc oxide).

The substrate 2 is a so-called array substrate and carries (thin film transistors; not shown) formed thereon. The first pixel electrodes 14 are electrically connected to the respective TFTs, and so are the second pixel electrodes 24 and the third pixel electrodes 34.

The first carrier transport layer 12, the second carrier transport layer 22, and the third carrier transport layer 32 may be made of a well-known material. The edge cover 3 may be made of a well-known material such as polyimide.

The first light-emitting layer 13 includes a plurality of first quantum-dot units 15. The second light-emitting layer 23 includes a plurality of second quantum-dot units 25. The third light-emitting layer 33 includes a plurality of third quantum-dot units 35. The first quantum-dot units 15, the second quantum-dot units 25, and the third quantum-dot units 35 have the same structure as quantum-dot units 91, which will be described later in detail.

Figure 4:
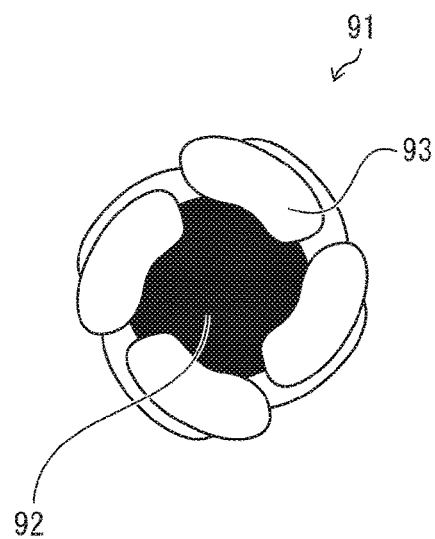
FIG. 4 is a schematic illustration of a quantum-dot unit.

FIG. 4 is a schematic illustration of the quantum-dot unit 91. Each quantum-dot unit 91 includes a quantum dot 92 and a ferritin 93. The quantum dot 92 may alternatively be referred to as the QD or the fluorescent QD particle. The ferritin 93 may alternatively be referred to as the ferritin protein.

The ferritin 93 is an iron binding protein. The ferritin 93 has a generally globular shell structure in cells of living organisms and is shaped like such a cage that can take up, inside the globular shell, the iron to which the ferritin 93 binds. The ferritin 93 has a function of storing iron in the cage and releasing the iron from the cage when needed. In the quantum-dot unit 91, the ferritin 93 encages the quantum dot 92 instead of iron.

A specific example of the ferritin 93 is an equine-derived recombinant ferritin. Other examples include human- and rat-derived ferritins. The ferritins 93 have a more or less common basic structure with an outer diameter of 12 nm and an inner diameter of 7 nm. Listeria monocytogenes-derived, tiny Dps protein is another type of the ferritin 93, which has an outer diameter of 9 nm and an inner diameter of 4.5 nm.

The ferritin 93 has a thickness of approximately 5 nm because the thickness should equal the outer diameter minus the inner diameter. Since the ferritin 93 is as thin as 5 nm, the quantum dot 92 encaged in the ferritin 93 is supplied with electrons by tunnel effect.

The quantum dots 92 may contain CdSe in its composition. The ferritin 93, covering such a quantum dot 92, may be formed by so-called slow chemical reaction. Specifically, ammonia is coordinated to a Cd ion to produce a tetrammine complex. Se ions are then supplied to this tetrammine complex by adding selenourea.

Figure 5:
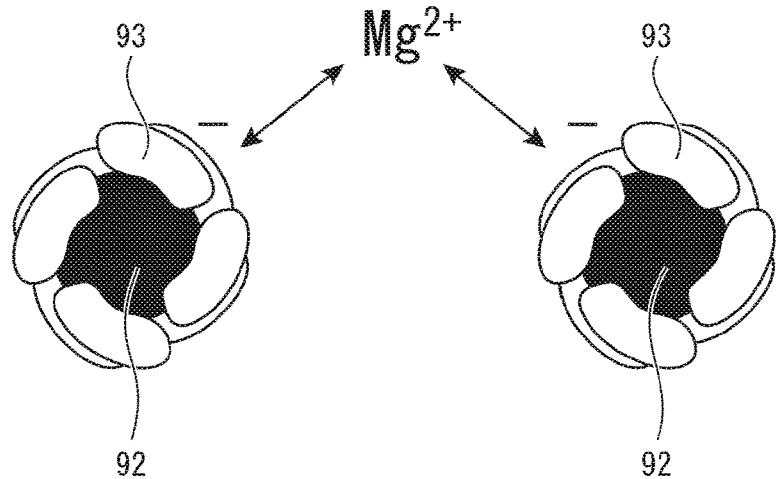
FIG. 5 is an illustration of a relationship between ferritin encaging a quantum dot and a cationic metal.

FIG. 5 is an illustration a relationship between the ferritin 93 encaging the quantum dot 92 and a cationic metal. There is a "metal-binding site" on the exterior of a cluster of ferritins 93. A structure that resembles a salt bridge forms between two ferritins 93 when a dicationic metal ion (ex., magnesium ion) binds to this metal-binding site, which strongly binds these ferritins 93.

Figure 6:
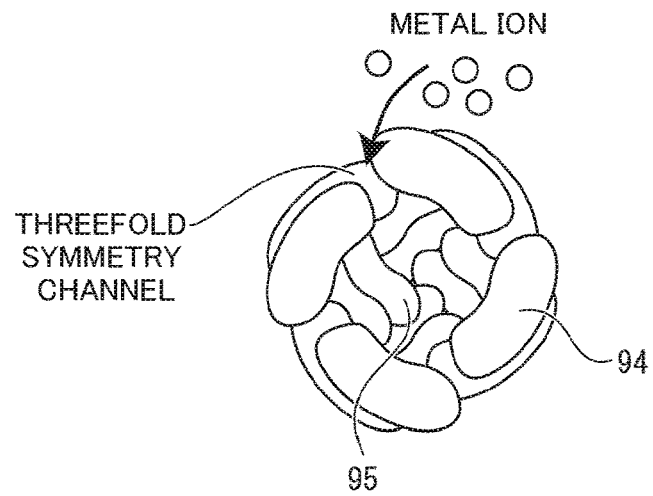
FIG. 6 is a perspective view of apoferritin encaging no quantum dot.

FIG. 6 is a perspective view of an apoferritin 94 encaging no quantum dot 92. The ferritin 93 is a spherical protein with a globular shell structure of 24 self-assembled subunits. The ferritin 93 is an iron-storage protein found in many living organisms from bacteria to plants to animals, including human and other mammals (e.g., horse and rat), soybean, maize, and cyanobacteria, as well as *Helicobacter pylori* which has come to be known as a cause of stomach cancer. These ferritins have almost the same basic structure and function and have therein a cavity 95 measuring a few nanometers in diameter. The ferritin derived from a spleen of a horse (mammal) is a globular, shell-like tetracosamer protein (total molecular weight, approximately 480,000) including two types of monomer subunits: a L chain with a molecular weight of approximately 19,000 and a H chain with a molecular weight of approximately 20,000.

The ferritin 93 measures approximately 12 nm in diameter and has the cavity 95 formed at the center thereof with a diameter of 7 nm. The ferritin 93 is capable of storing approximately 4,500 iron elements per ferritin molecule in the form of a ferrihydrite ($5Fe_2O_3 \cdot 9H_2O$) crystal in this cavity 95. The ferritin 93 reduces and discharges this iron when the organism is iron deficient, to keep the organism's iron ion concentration in balance.

The ferritin 93 is an optimal biotemplate because the ferritin 93 has both self-assembly capability and biomineralization capability. A ferritin has a core (nanoparticle) in the cavity 95, whereas an apoferritin has no core in the cavity 95. Various nanoparticles may be created inside the apoferritin 94.

The quantum dot 92 and the ferritin 93 in the first quantum-dot unit 15 correspond respectively to a first quantum dot 16 and a ferritin 17. The quantum dot 92 and the ferritin 93 in the second quantum-dot unit 25 correspond respectively to a second quantum dot 26 and a ferritin 27. The quantum dot 92 and the ferritin 93 in the third quantum-dot unit 35 correspond respectively to a third quantum dot 36 and a ferritin 37.

The first pixel electrode 14 is made of metal. Assume, as an example, that the first pixel electrode 14 contains metal A. The ferritin 17 is modified with a first peptide that identifies this metal A. The language, "to identify a metal," means "to selectively attach to or adsorb a metal." The first pixel electrode 14 is bound to the first peptide by, for example, ionic bonding. This particular structure enables the first quantum dots 16 to be selectively positioned on the first pixel electrode 14 in response to the electrostatic interaction between the first pixel electrode 14 and the first peptide. That in turn eliminates the need to provide a partition wall for coating quantum dots with different materials around the first pixel electrode 14. This absence of the partition wall enables achieving a high aperture ratio and a high luminance with the display device 101.

The second pixel electrode 24 is made of metal. Assume, as an example, that the second pixel electrode 24 contains metal B. The ferritin 27 is modified with a second peptide that identifies this metal B. The second pixel electrode 24 is bound to the second peptide by, for example, ionic bonding. This particular structure enables the second quantum dots 26 to be selectively positioned on the second pixel electrode 24 in response to the electrostatic interaction between the second pixel electrode 24 and the second peptide. That in turn eliminates the need to provide a partition wall for coating quantum dots with different materials around the second pixel electrode 24. This absence of the partition wall enables achieving a high aperture ratio and a high luminance with the display device 101.

The third pixel electrode 34 is made of metal. Assume, as an example, that the third pixel electrode 34 contains metal C. The ferritin 37 is modified with a third peptide that identifies this metal C. The third pixel electrode 34 is bound to the third peptide by, for example, ionic bonding. This particular structure enables the third quantum dots 36 to be selectively positioned on the third pixel electrode 34 in response to the electrostatic interaction between the third pixel electrode 34 and the third peptide, That in turn eliminates the need to provide a partition wall for coating quantum dots with different materials around the third pixel electrode 34. This absence of the partition wall enables achieving a high aperture ratio and a high luminance with the display device 101.

The subunit of the ferritins 17, 27, and 37 has a N-terminal sticking out of the outer shell of the ferritins (molecules) 17, 27, and 37, The N-terminal is modified with a peptide that binds to an associated metal to synthesize the ferritins 17, 27, and 37.

The first pixel electrode 14 includes a first base portion 18 and a first metal material 19 on the first base portion 18. The second pixel electrode 24 includes a second base portion 28 and a second metal material 29 on the second base portion 28. The third pixel electrode 34 includes a third base portion 38 and a third metal material 39 on the third base portion 38.

The first base portion 18, the second base portion 28, and the third base portion 38 form the base portion of the first pixel electrode 14, the base portion of the second pixel electrode 24, and the base portion of the third pixel electrode 34 respectively. All the first base portion 18, the second base portion 28, and the third base portion 38 are preferably made of a light-reflecting metal such as Mg, Ag, or an Mg—Ag alloy.

The first metal material 19 forms the surface of the first pixel electrode 14 and is bound to the first peptide modifying the ferritin 17. In other words, the first metal material 19 contains a metal that is to be identified by the first peptide. The second metal material 29 forms the surface of the second pixel electrode 24 and is bound to the second peptide modifying the ferritin 27. In other words, the second metal material 29 contains a metal that is to be identified by the second peptide. The third metal material 39 forms the surface of the third pixel electrode 34 and is bound to the third peptide modifying the ferritin 37. In other words, the third metal material 39 contains a metal that is to be identified by the third peptide.

The first metal material 19, the second metal material 29, and the third metal material 39 are selected in accordance with the type of the metal to be identified by the peptide to which the first metal material 19, the second metal material 29, and the third metal material 39 is to be bound respectively. Examples of the selected metals include Au, Pt, Pd, Ti, Ag, and Ni. The first metal material 19, the second metal material 29, and the third metal material 39 each need only to contain at least one of these examples of the selected metals.

Note that the first metal material 19 and the second metal material 29 are of different types, that the second metal material 29 and the third metal material 39 are of different types, and that the third metal material 39 and the first metal material 19 are of different types. In short, the type of the metal material that forms the first metal material 19, the type of the metal material that forms the second metal material 29, and the type of the metal material that forms the third metal material 39 are mutually different. This particular set of compositions enables preventing the first light-emitting layer 13, the second light-emitting layer 23, and the third light-emitting layer 33 from being contaminated with unwanted quantum dots.

Since the first pixels P1 emit blue light, the first light-emitting layer 13 emits blue light. Since the second pixels P2 emit green light, the second light-emitting layer 23 emits green light. Since the third pixels P3 emit red light, the third light-emitting layer 33 emits red light. In this example, the band gap is smallest in the third light-emitting layer 33, then in the second light-emitting layer 23, and largest in the first light-emitting layer 13. An example is now considered where anodes and cathodes are combined as shown in FIGS. 2 and 3 (the common electrode 1 is a cathode, whereas the first pixel electrode 14, the second pixel electrode 24, and the third pixel electrode 34 are anodes). In this particular example, when taking into account the carrier injection efficiency for the first light-emitting layer 13, the second light-emitting layer 23, and the third light-emitting layer 33, the work function is preferably smallest in the third metal material 39, then in the second metal material 29, and largest in the first metal material 19. In this perspective, the first metal material 19 may possibly contain Pt (work function, e.g. 5.65). In such a case, the second metal material 29 may possibly contain Pd (work function, e.g. 4.9). In such a case, the third metal material 39 may possibly contain Au (work function, e.g. 4.77) This particular set of compositions allows for suitable adjustment of the carrier injection efficiency in the first light-emitting layer 13, the second light-emitting layer 23, and the third light-emitting layer 33.

FIGS. 7 to 11 are cross-sectional views depicting a method of manufacturing the display device 101 in accordance with Embodiment 1 of the disclosure. FIGS. 7 to 11, as well as FIGS. 12, 13, and 16 to 26 (detailed later), each have portion (a) and portion (b). Portions (b) are cross-sectional views similar to the cross-sectional view taken along line A-A shown in FIG. 1 (see FIGS. 2 and 14), and portions (a) are cross-sectional views similar to the cross-sectional view taken along line B-B shown in FIG. 1 (see FIGS. 3 and 15). The following description will make reference to FIGS. 7 to 11, as well as to FIGS. 2 and 3.

Figure 7:
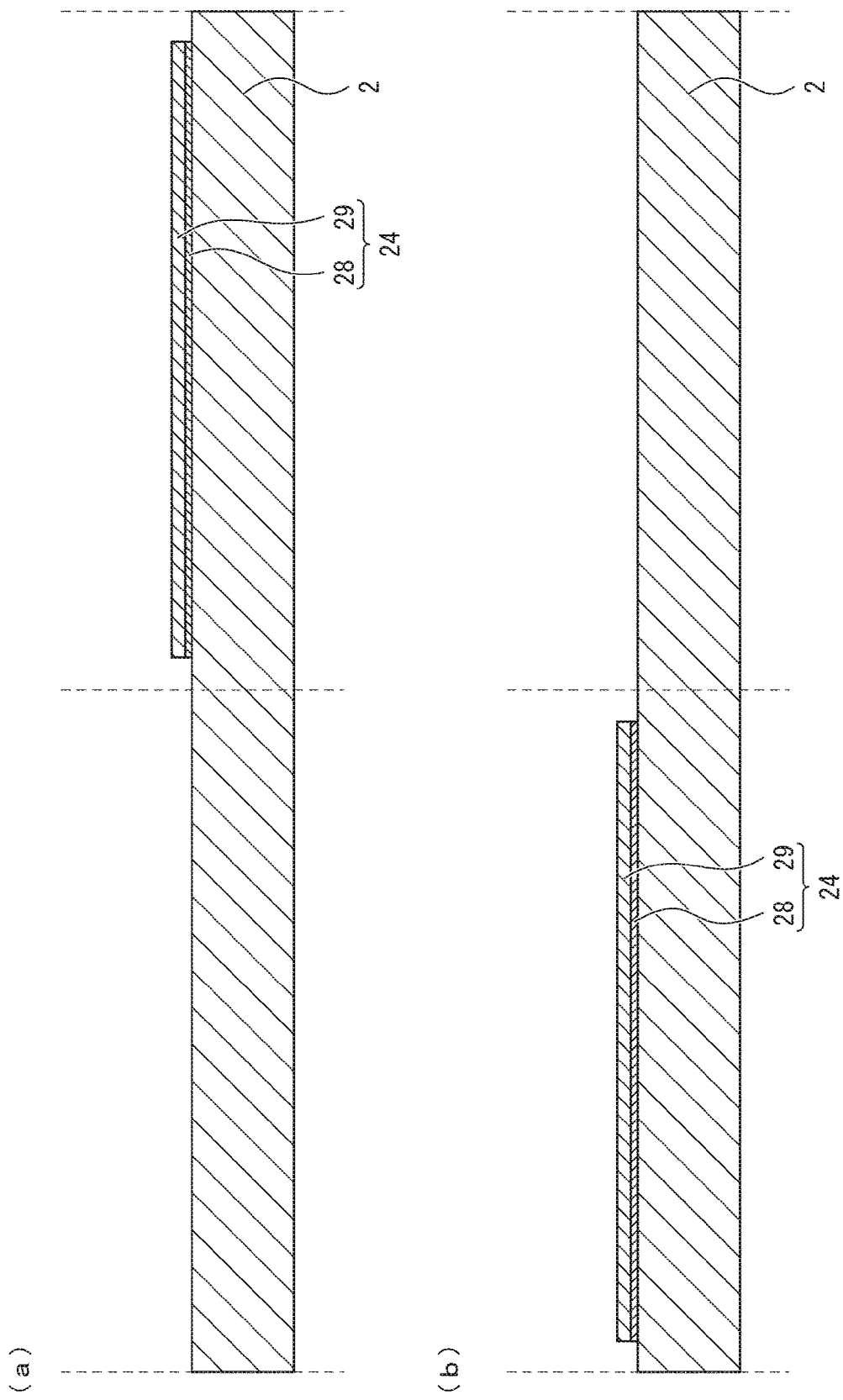
FIG. 7 is a cross-sectional view depicting a method of manufacturing a display device in accordance with Embodiment 1 of the disclosure.

First, the second pixel electrode 24 is formed on the substrate 2 by using, for example, a photomask as shown in FIG. 7. The second pixel electrode 24 may be formed by, for example, vapor deposition or sputtering. Specifically, the second base portion 28 and the primarily Pd, second metal material 29 are stacked in this order in the step shown in FIG. 7.

Figure 8:
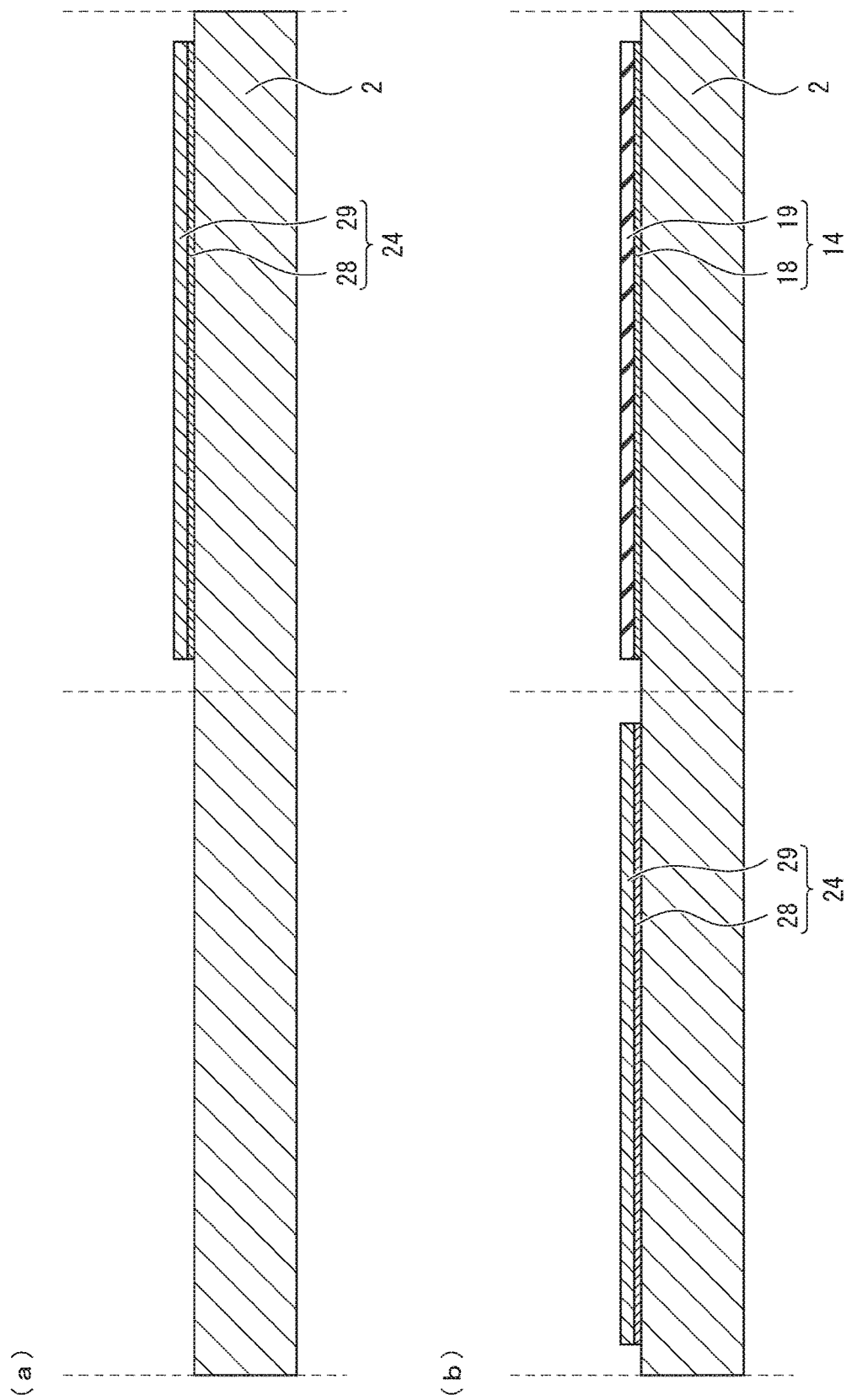
FIG. 8 is a cross-sectional view depicting the method of manufacturing a display device in accordance with Embodiment 1 of the disclosure.

Subsequently, the first pixel electrode 14 is formed on the substrate 2 by using, for example, a photomask as shown in FIG. 8. The first pixel electrode 14 may be formed by, for example, vapor deposition or sputtering. Specifically, the first base portion 18 and the primarily Pt, first metal material 19 are stacked in this order in the step shown in FIG. 8.

Figure 9:
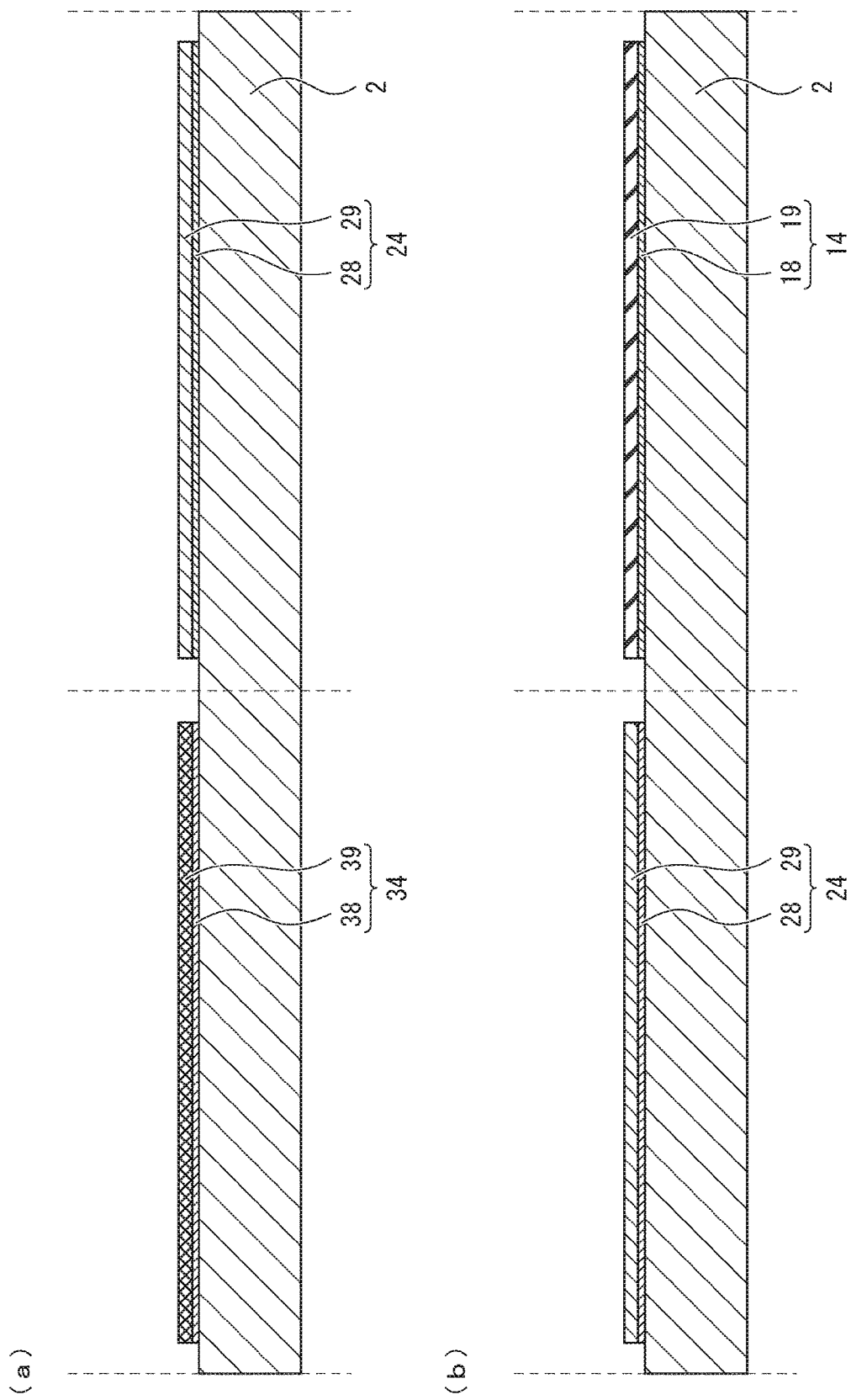
FIG. 9 is a cross-sectional view depicting the method of manufacturing a display device in accordance with Embodiment 1 of the present invention-disclosure.

Subsequently, the third pixel electrode 34 is formed on the substrate 2 by using, for example, a photomask as shown in FIG. 9. The third pixel electrode 34 may be formed by, for example, vapor deposition or sputtering. Specifically, the third base portion 38 and the primarily Au, third metal material 39 are stacked in this order in the step shown in FIG. 9.

The series of steps shown in FIGS. 7 to 9 corresponds to an electrode forming step. In this electrode forming step, the first metal material 19, which forms the surface of the first pixel electrode 14, and the second metal material 29, which forms the surface of the second pixel electrode 24, are of different types.

Figure 10:
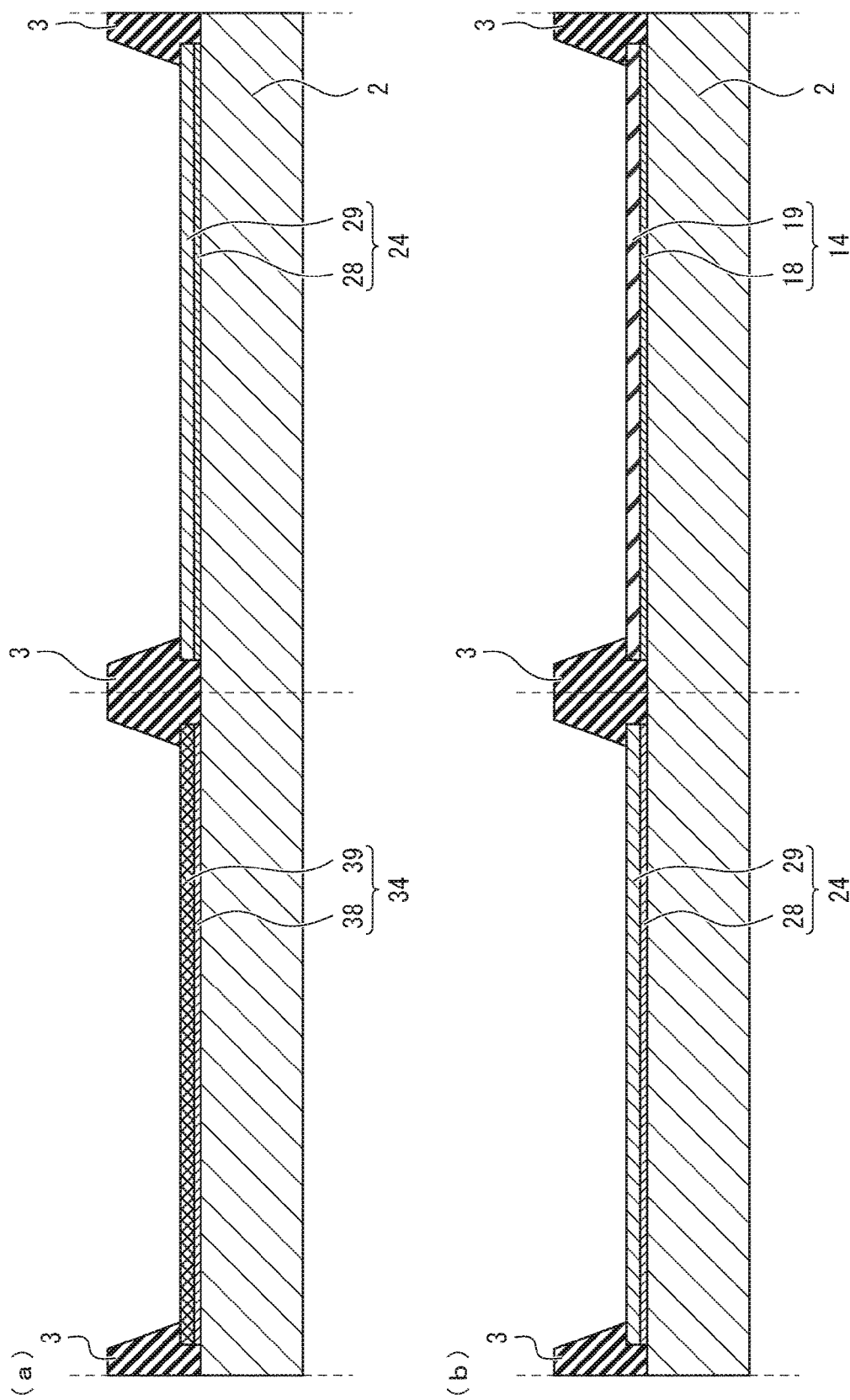
FIG. 10 is a cross-sectional view depicting the method of manufacturing a display device in accordance with Embodiment 1 of the disclosure.

Subsequently, the edge cover 3 is formed of polyimide around the first pixel electrode 14, the second pixel electrode 24, and the third pixel electrode 34 by a well-known patterning technique as shown in FIG. 10 (edge cover forming step). The edge cover 3 has a height of, for example, from 1 μm to 1.5 μm, both inclusive. The provision of the edge cover 3 prevents an electric field from concentrating between each adjacent pair of the first pixel electrode 14, the second pixel electrode 24, and the third pixel electrode 34.

Figure 11:
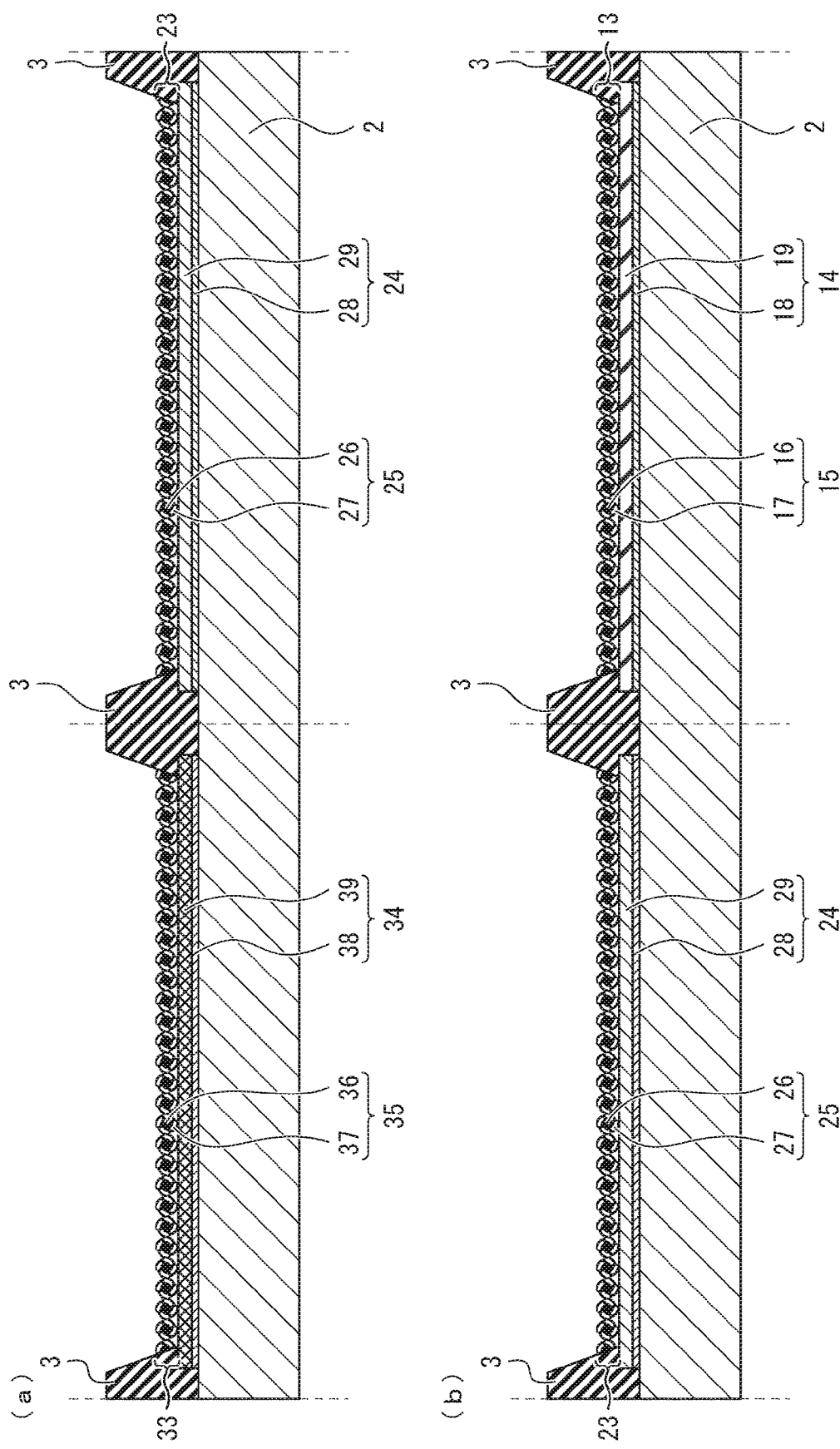
FIG. 11 is a cross-sectional view depicting the method of manufacturing a display device in accordance with Embodiment 1 of the disclosure.

Subsequently, the first light-emitting layer 13 is formed on the first pixel electrode 14 as shown in FIG. 11 (first light-emitting layer forming step). Specifically, a first solution containing the first quantum-dot units 15 is dispensed dropwise (applied) to the top face of the first pixel electrode 14 and left to stand for a while in the step shown in FIG. 11. This step binds the first metal material 19 and the first peptide modifying the ferritin 17 encaging the first quantum dot 16. The metal to be identified here by the first peptide is Pt. Thereafter, an excess amount of the first solution in terms of the formation of the first light-emitting layer 13 is removed. This excess amount may be removed by, for example, centrifugal processing. The first quantum-dot units 15 may be arranged two-dimensionally on the first pixel electrode 14 in the first light-emitting layer 13 prepared by these steps.

The second light-emitting layer 23 is formed on the second pixel electrode 24 as shown in FIG. 11 (second light-emitting layer forming step). Specifically, a second solution containing the second quantum-dot units 25 is dispensed dropwise (applied) to the top face of the second pixel electrode 24 and left to stand for a while in the step shown in FIG. 11. This step binds the second metal material 29 and the second peptide modifying the ferritin 27 encaging the second quantum dot 26. The metal to be identified here by the second peptide is Pd. Thereafter, an excess amount of the second solution in terms of the formation of the second light-emitting layer 23 is removed. This excess amount may be removed by, for example, centrifugal processing. The second quantum-dot units 25 may be arranged two-dimensionally on the second pixel electrode 24 in the second light-emitting layer 23 prepared by these steps.

The third light-emitting layer 33 is formed on the third pixel electrode 34 as shown in FIG. 11 (third light-emitting layer forming step). Specifically, a third solution containing the third quantum-dot units 35 is dispensed dropwise (applied) to the top face of the third pixel electrode 34 and left to stand for a while in the step shown in FIG. 11. This step binds the third metal material 39 and the third peptide modifying the ferritin 37 encaging the third quantum dot 36. The metal to be identified here by the third peptide is Au. Thereafter, an excess amount of the third solution in terms of the formation of the third light-emitting layer 33 is removed. This excess amount may be removed by, for example, centrifugal processing. The third quantum-dot units 35 may be arranged two-dimensionally on the third pixel electrode 34 in the third light-emitting layer 33 prepared by these steps.

The excess amount of the first solution in terms of the for nation of the first light-emitting layer 13 may be recovered by, for example, collecting the cleaning solution used for washing an intermediate of the display device 101 shown in FIG. 11. This procedure can lower the risk of the first solution having adverse effects in subsequent steps while reducing the cost related to the first solution.

The excess amount of the second solution in terms of the formation of the second light-emitting layer 23 may be recovered by, for example, collecting the cleaning solution used for washing an intermediate of the display device 101 shown in FIG. 11. This procedure can lower the risk of the second solution having adverse effects in subsequent steps while reducing the cost related to the second solution.

The excess amount of the third solution in terms of the formation of the third light-emitting layer 33 may be recovered by, for example, collecting the cleaning solution used for washing an intermediate of the display device 101 shown in FIG. 11. This procedure can lower the risk of the third solution having adverse effects in subsequent steps while reducing the cost related to the third solution.

A mixed solution prepared by mixing the first solution, the second solution, and the third solution may be dispensed dropwise (applied) to the top face of the first pixel electrode 14, the top face of the second pixel electrode 24, and the top face of the third pixel electrode 34 in the step shown in FIG. 11.

In the step shown in FIG. 11, the mixed solution may be applied collectively to two or more of the top face of the first pixel electrode 14, the top face of the second pixel electrode 24, and the top face of the third pixel electrode 34. In other words, two or more of the first light-emitting layer 13, the second light-emitting layer 23, and the third light-emitting layer 33 may be simultaneously formed respectively on the first pixel electrode 14, the second pixel electrode 24, and the third pixel electrode 34. This procedure reduces the number of steps needed to form the first light-emitting layer 13, the second light-emitting layer 23, and the third light-emitting layer 33, thereby improving productivity for the display device 101.

The excess amount of the mixed solution in terms of the formation of the first light-emitting layer 13, the second light-emitting layer 23, and the third light-emitting layer 33 may be removed or recovered similarly to when the first solution, the second solution, and the third solution are used separately.

Subsequently, the first carrier transport layer 12 is stacked on the first light-emitting layer 13, the second carrier transport layer 22 is stacked on the second light-emitting layer 23, and the third carrier transport layer 32 is stacked on the third light-emitting layer 33 as shown in FIGS. 2 and 3. The common electrode 1 is then stacked on the first carrier transport layer 12, the second carrier transport layer 22, and the third carrier transport layer 32 as shown in FIGS. 2 and 3. The first carrier transport layer 12, the second carrier transport layer 22, and the third carrier transport layer 32 may be fowled by sputtering, coating and baking, or applying nanoparticles. The common electrode 1 may be formed by sputtering or coating and baking.

The ferritin 17, the ferritin 27, and the ferritin 37 might be undesirably burnt off in an atmosphere above 80° C. In view of this risk, the common electrode 1 is preferably formed in such a relatively low-temperature environment that the ferritin 17, the ferritin 27, and the ferritin 37 could not be burnt off. The same applies to the formation of the first carrier transport layer 12, the second carrier transport layer 22, and the third carrier transport layer 32.

The first pixel electrode 14, the second pixel electrode 24, and the third pixel electrode 34 need to be separated from each other in the structure shown in FIGS. 2 and 3. Meanwhile, the first carrier transport layer 12, the second carrier transport layer 22, and the third carrier transport layer 32, although being provided integrally, may be separated from each other (in other words, may be provided in an insular manner). In addition, the common electrode 1 is provided above and across the first carrier transport layer 12, the second carrier transport layer 22, and the third carrier transport layer 32 as described earlier.

FIGS. 2 and 3 show the top portion of the edge cover 3 as being higher than any of the top face of the first light-emitting layer 13, the top face of the second light-emitting layer 23, and the top face of the third light-emitting layer 33, to render the edge cover 3 clearly recognizable. Unlike the partition wall, however, the edge cover 3 is not provided for the purpose of separating each adjacent pair of the first light-emitting layer 13, the second light-emitting layer 23, and the third light-emitting layer 33 in liquid coating. The top portion of the edge cover 3 may be lower than at least one of the top face of the first light-emitting layer 13, the top face of the second light-emitting layer 23, and the top face of the third light-emitting layer 33. The top portion of the edge cover 3 may also be lower than at least one of the bottom face of the first light-emitting layer 13, the bottom face of the second light-emitting layer 23, and the bottom face of the third light-emitting layer 33. These structures can be accommodated in the display device 101.

Embodiment 2

Figure 12:
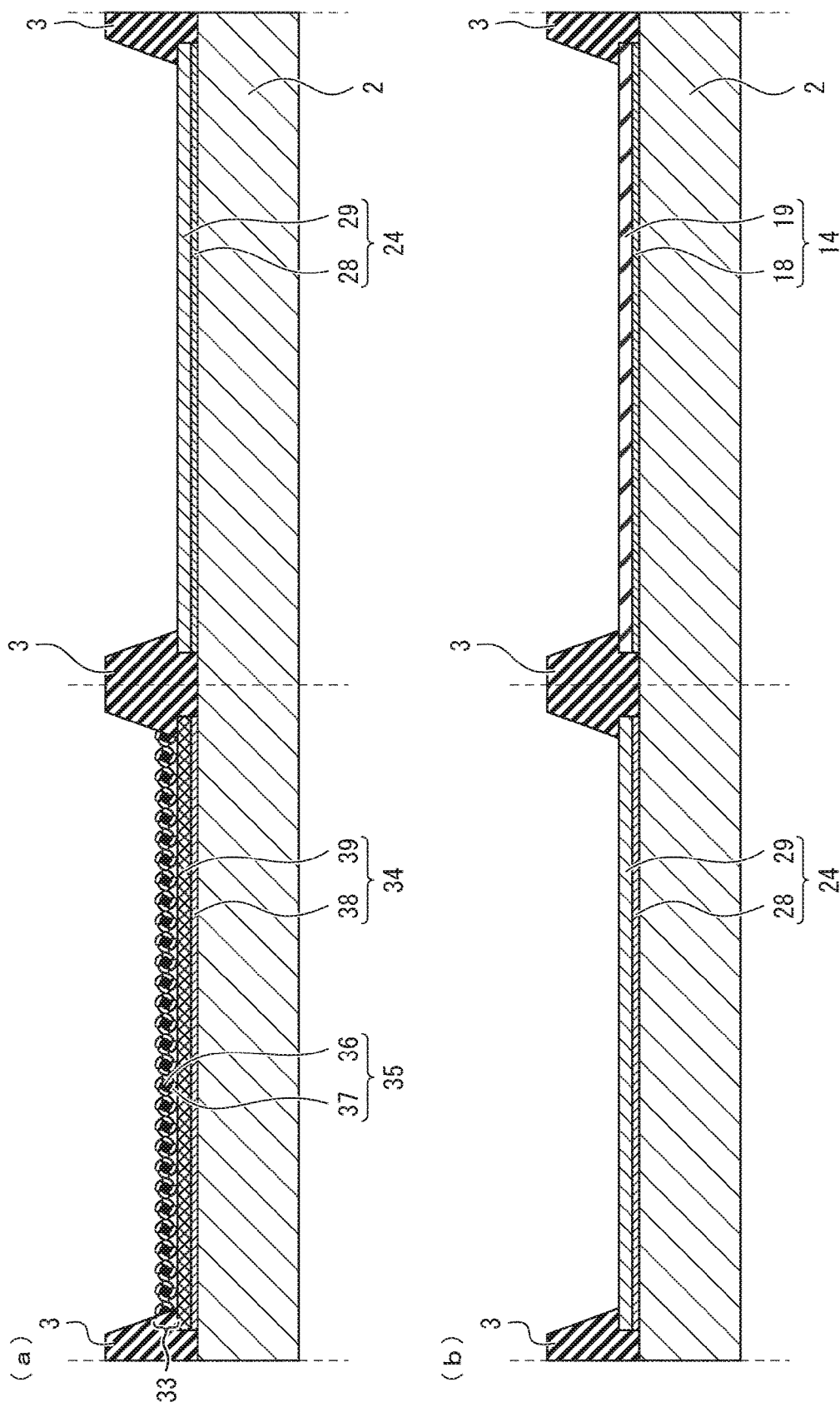
FIG. 12 is a cross-sectional view depicting a method of manufacturing a display device in accordance with Embodiment 2 of the disclosure.
Figure 13:
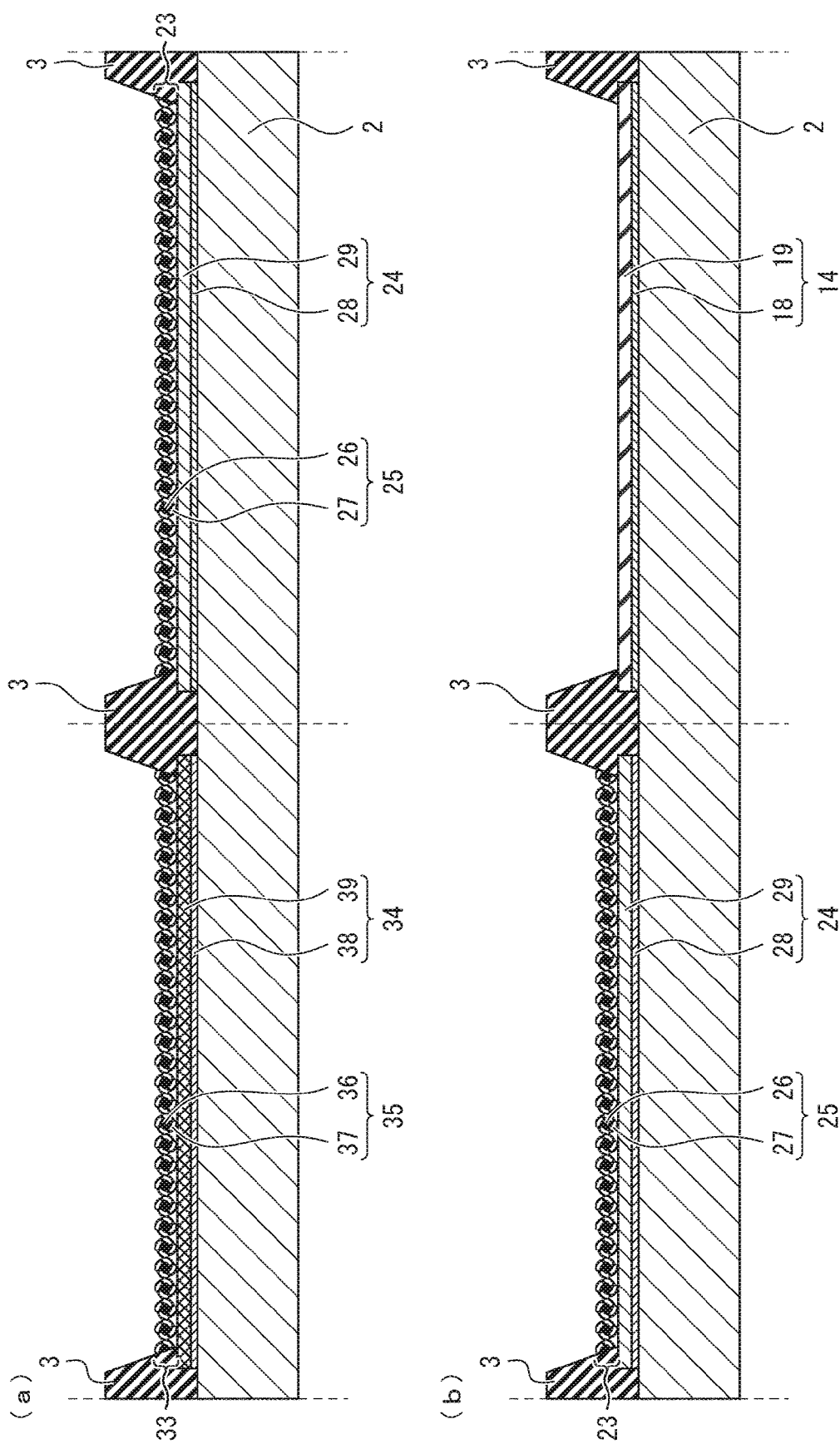
FIG. 13 is a cross-sectional view depicting the method of manufacturing a display device in accordance with Embodiment 2 of the disclosure.

FIGS. 12 and 13 are cross-sectional views depicting a method of manufacturing the display device 101 in accordance with Embodiment 2 of the disclosure. This method of manufacturing the display device 101 in accordance with Embodiment 2 of the disclosure further includes the steps shown in FIGS. 2, 3, and 7 to 11.

Both FIGS. 12 and 13 show a state that follows the state shown in FIG. 10 and precedes the state shown in FIG. 11. The third light-emitting layer 33 is formed before the first light-emitting layer 13 and the second light-emitting layer 23 are formed, in the step shown in FIG. 12. The second light-emitting layer 23 is formed before the first light-emitting layer 13 is formed, in the step shown in FIG. 13.

Two or more of the first light-emitting layer 13, the second light-emitting layer 23, and the third light-emitting layer 33 may be formed in this manner respectively on the first pixel electrode 14, the second pixel electrode 24, and the third pixel electrode 34 at different timings and in any order.

Embodiment 3

Figure 14:
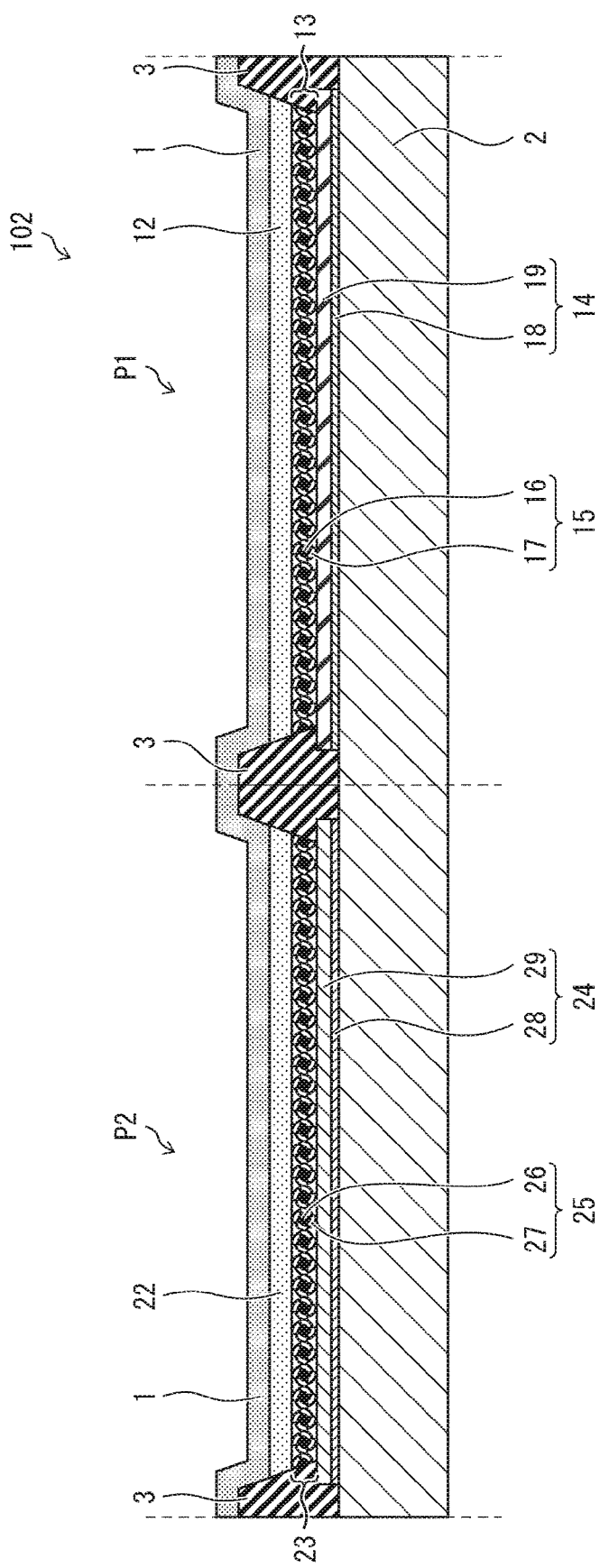
FIG. 14 is a cross-sectional view taken along line A-A shown in FIG. 1 in accordance with Embodiment 3 of the disclosure.
Figure 15:
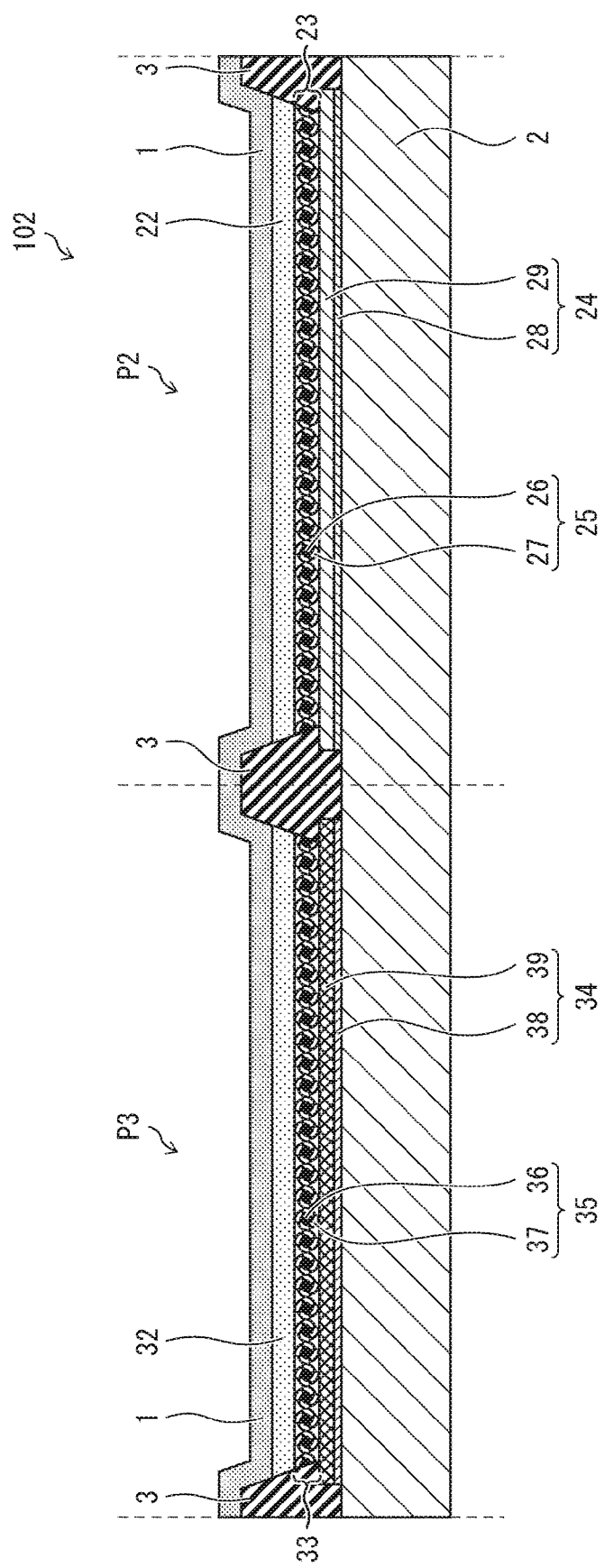
FIG. 15 is a cross-sectional view taken along line B-B shown in FIG. 1 in accordance with Embodiment 3 of the disclosure.
Figure 16:
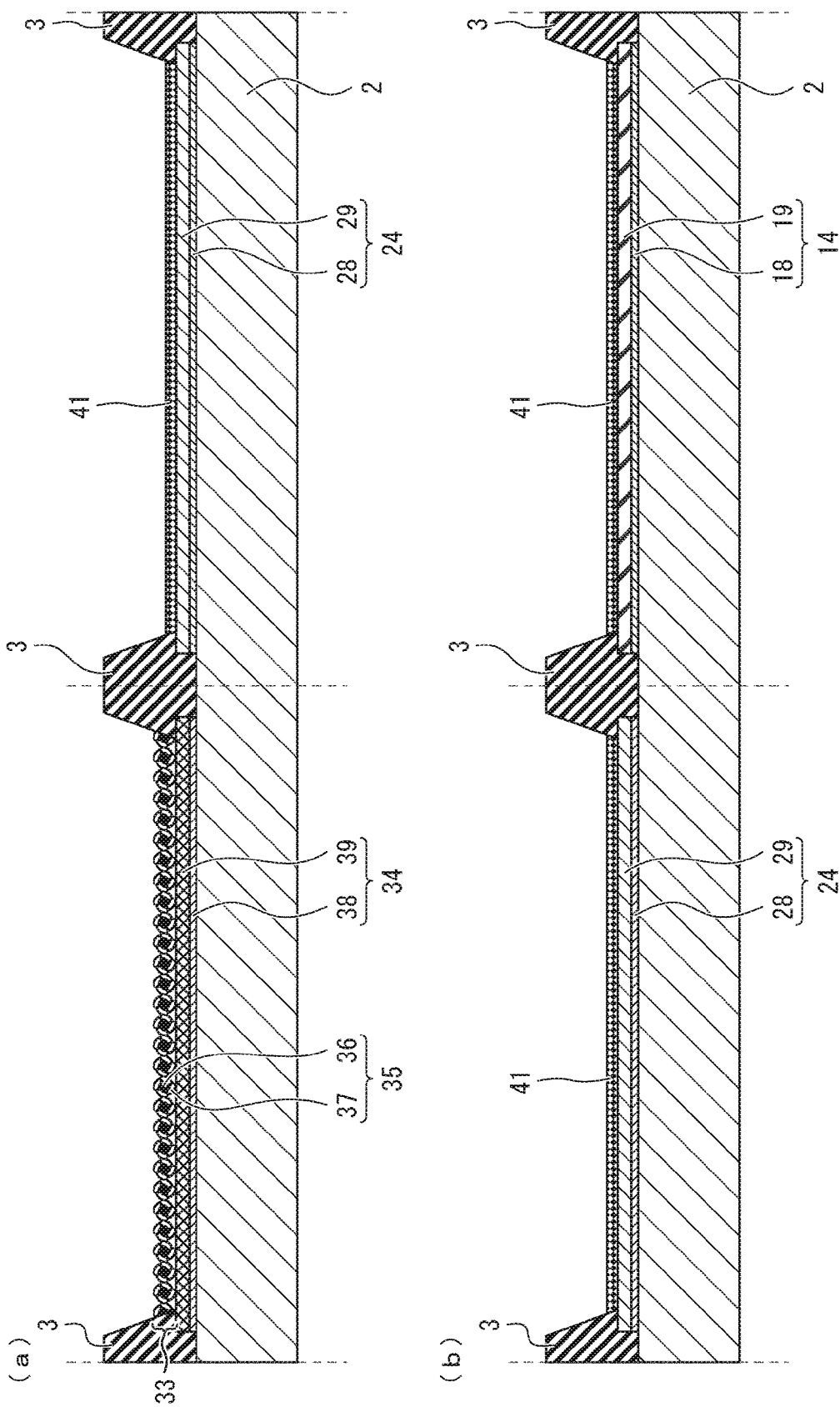
FIG. 16 is a cross-sectional view depicting a method of manufacturing a display device in accordance with Embodiment 3 of the disclosure.
Figure 17:
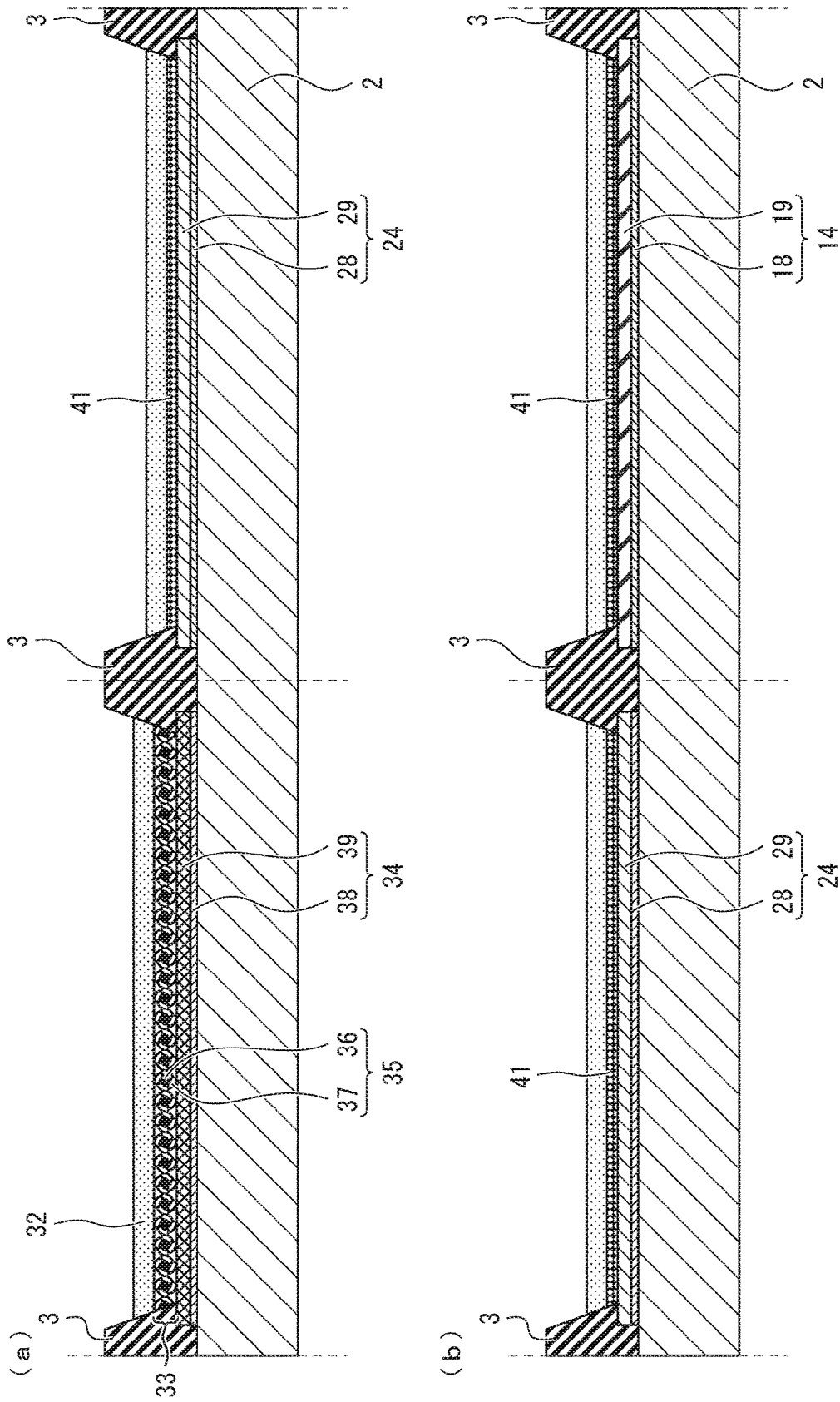
FIG. 17 is a cross-sectional view depicting the method of manufacturing a display device in accordance with Embodiment 3 of the disclosure.
Figure 18:
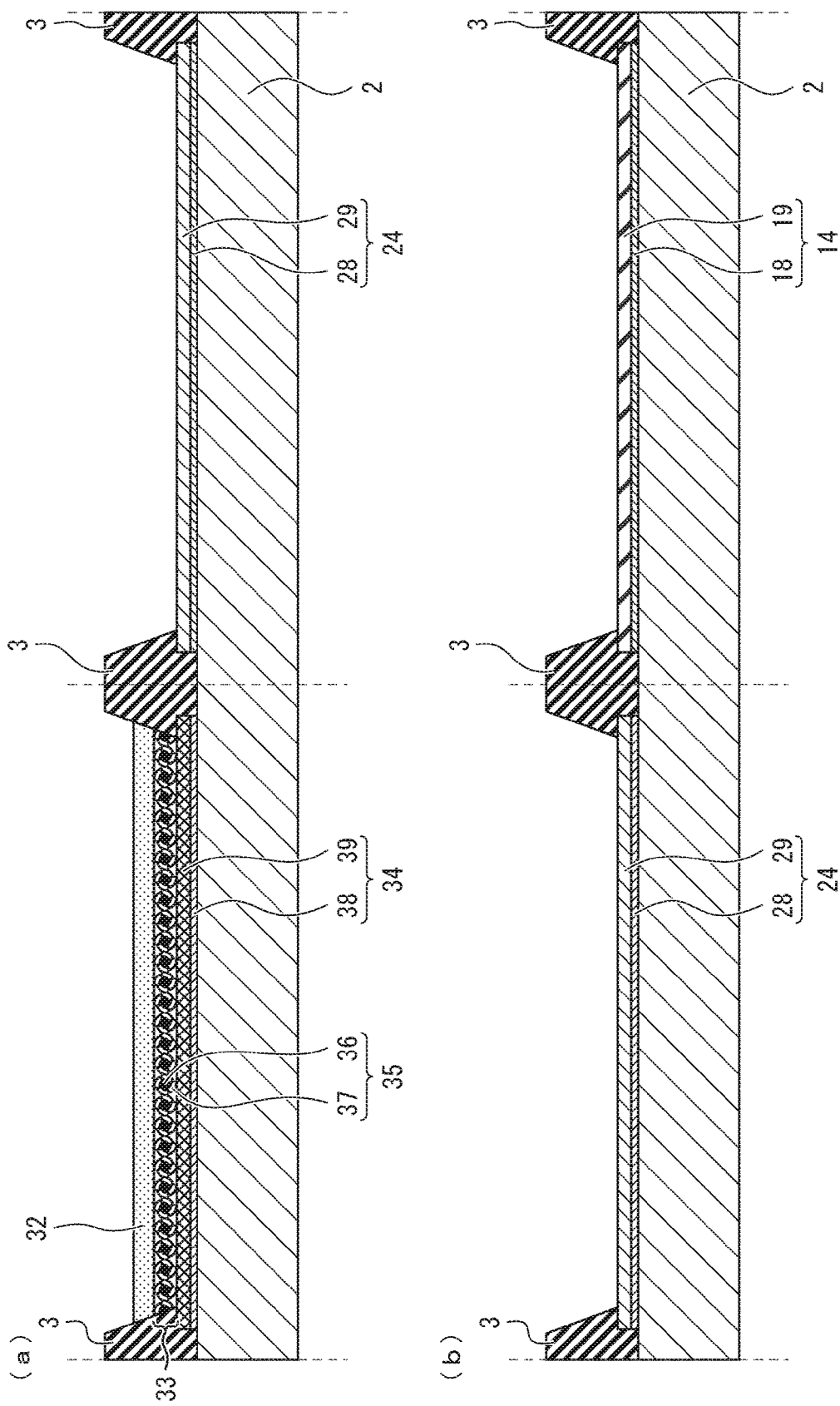
FIG. 18 is a cross-sectional view depicting the method of manufacturing a display device in accordance with Embodiment 3 of the disclosure.

FIG. 14 is a cross-sectional view taken along line A-A shown in FIG. 1 in accordance with Embodiment 3 of the disclosure. FIG. 15 is a cross-sectional view taken along line B-B shown in FIG. 1 in accordance with Embodiment 3 of the disclosure. The display device 102 in accordance with Embodiment 3 of the disclosure has the same structure as the display device 101, except that the first carrier transport layer 12, the second carrier transport layer 22, and the third carrier transport layer 32 are separated from each other in the former.

FIGS. 16 to 26 are cross-sectional views depicting a method of manufacturing the display device 102 in accordance with Embodiment 3 of the disclosure. This method of manufacturing the display device 102 in accordance with Embodiment 3 of the disclosure further includes the steps shown in FIGS. 2, 3, 7 to 10, and 12.

The following description begins where the third light-emitting layer 33 is completely formed (see FIG. 12) before forming the first light-emitting layer 13 and the second light-emitting layer 23. Photoresist 41 is provided in the step shown in FIG. 16 on the first pixel electrode 14 on which the first light-emitting layer 13 is yet to be formed and on the second pixel electrode 24 on which the second light-emitting layer 23 is yet to be formed. No photoresist 41 is provided on the third light-emitting layer 33. Subsequently, the third carrier transport layer 32 is stacked on the third light-emitting layer 33 in the step shown in FIG. 17. Subsequently, the photoresist 41 is lifted off in the step shown in FIG. 18.

Figure 19:
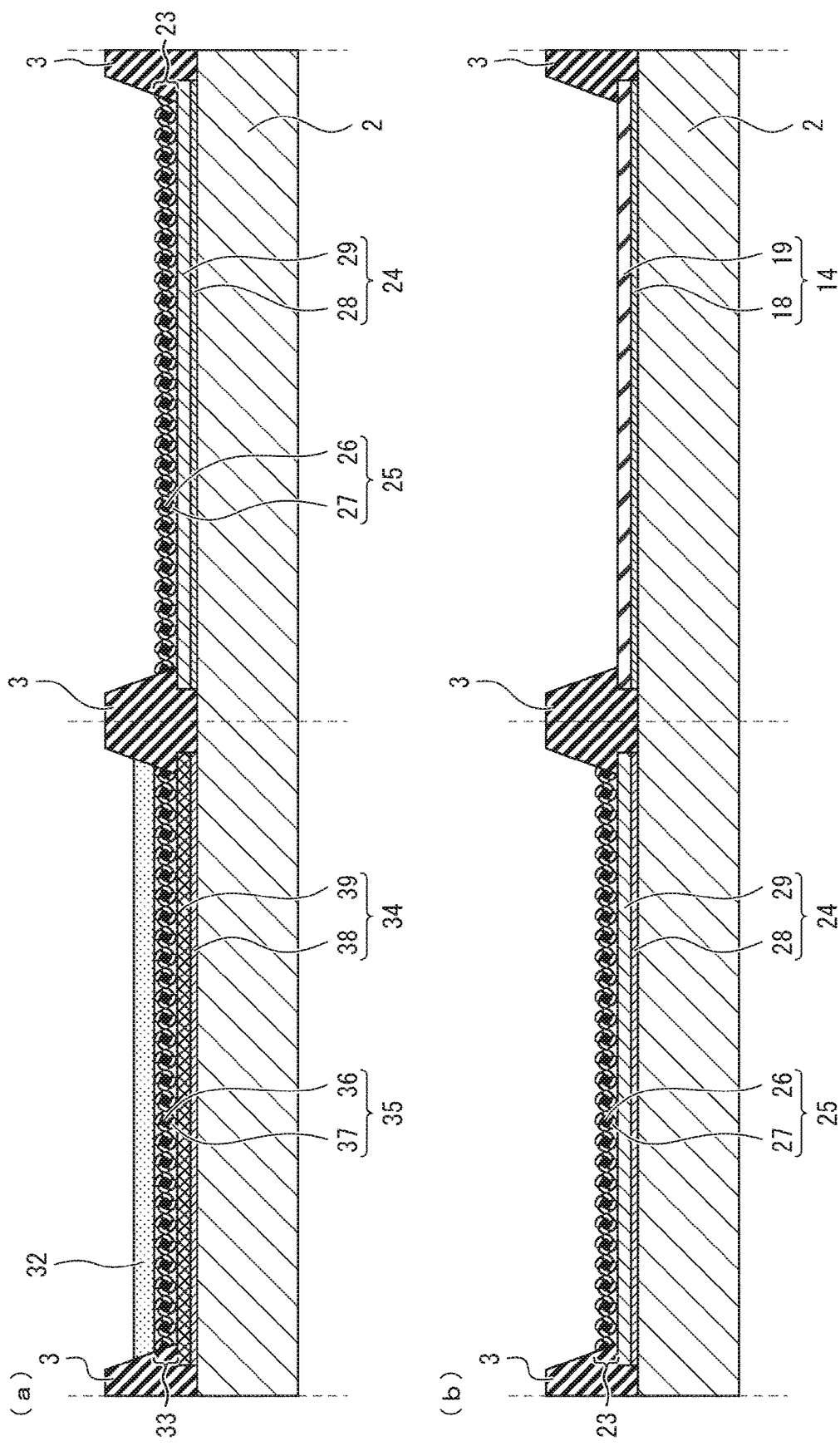
FIG. 19 is a cross-sectional view depicting the method of manufacturing a display device in accordance with Embodiment 3 of the disclosure.
Figure 20:
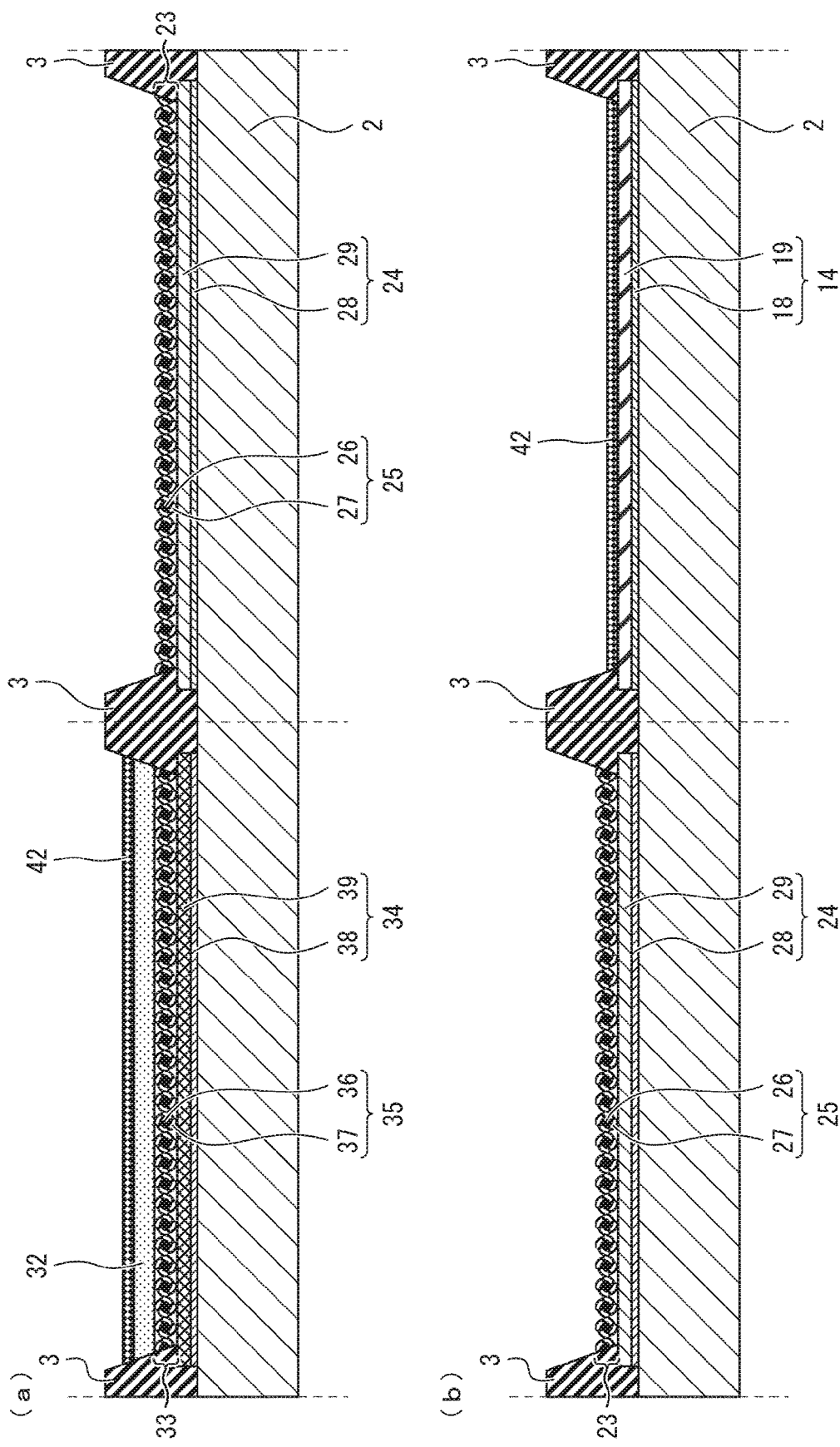
FIG. 20 is a cross-sectional view depicting the method of manufacturing a display device in accordance with Embodiment 3 of the disclosure.
Figure 21:
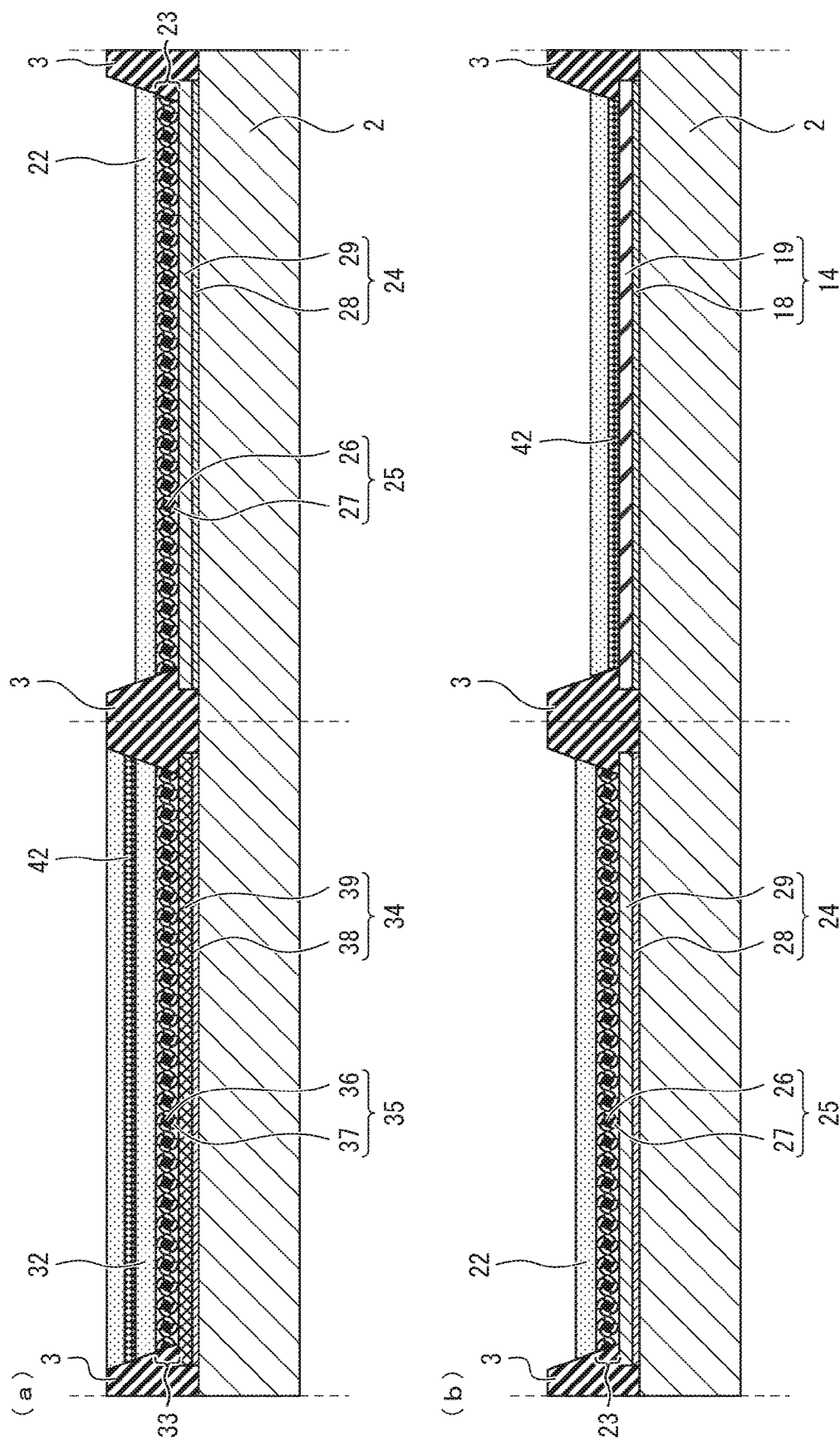
FIG. 21 is a cross-sectional view depicting the method of manufacturing a display device in accordance with Embodiment 3 of the disclosure.
Figure 22:
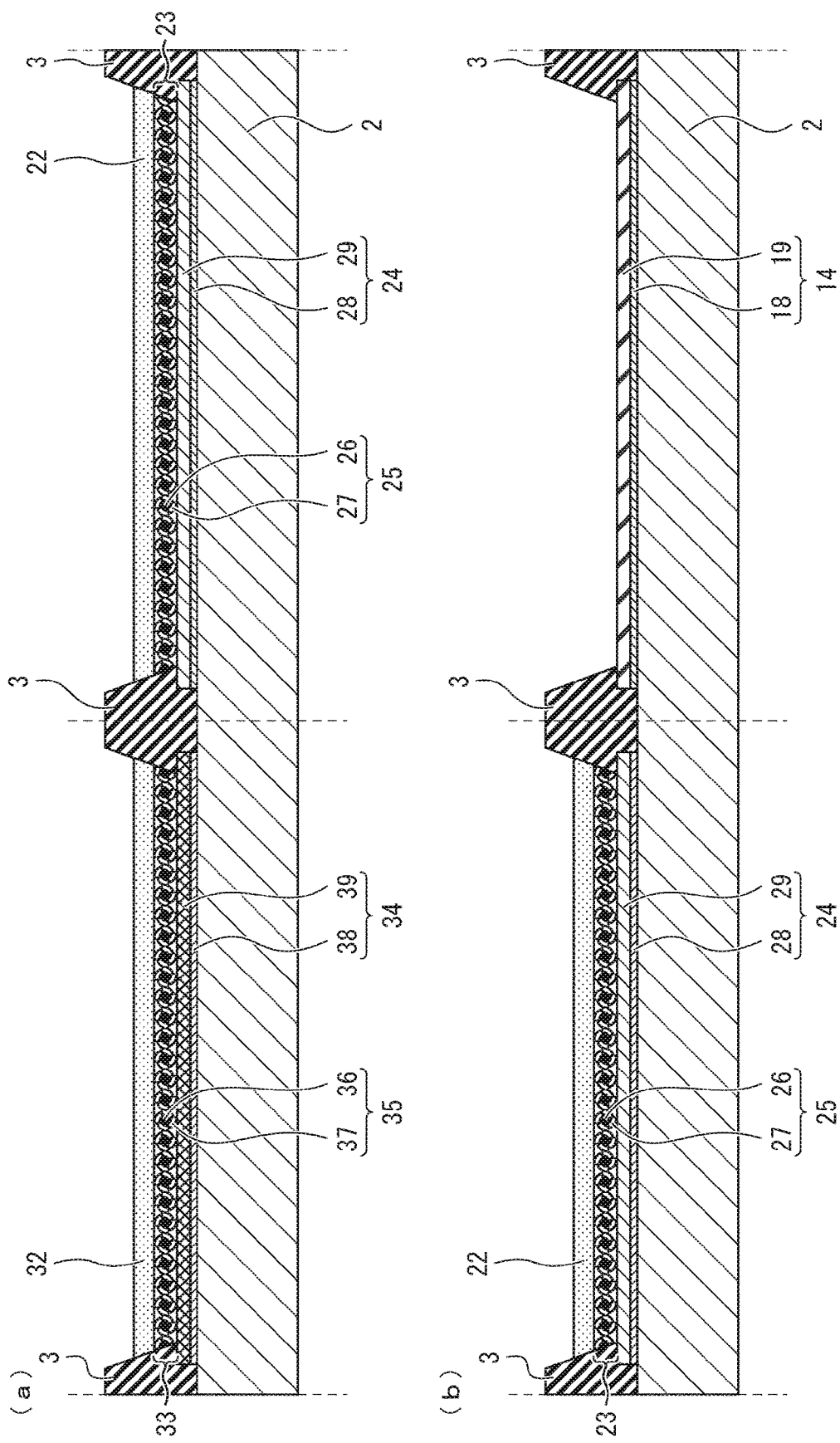
FIG. 22 is a cross-sectional view depicting the method of manufacturing a display device in accordance with Embodiment 3 of the disclosure.

Subsequently, the second light-emitting layer 23 is formed in the step shown in FIG. 19 before forming the first light-emitting layer 13. Subsequently, photoresist 42 is provided in the step shown in FIG. 20 on the third carrier transport layer 32 and the first pixel electrode 14 on which the first light-emitting layer 13 is yet to be formed. No photoresist 42 is provided on the second light-emitting layer 23. Subsequently, the second carrier transport layer 22 is stacked on the second light-emitting layer 23 in the step shown in FIG. 21. Subsequently, the photoresist 42 is lifted off in the step shown in FIG. 22.

Figure 23:
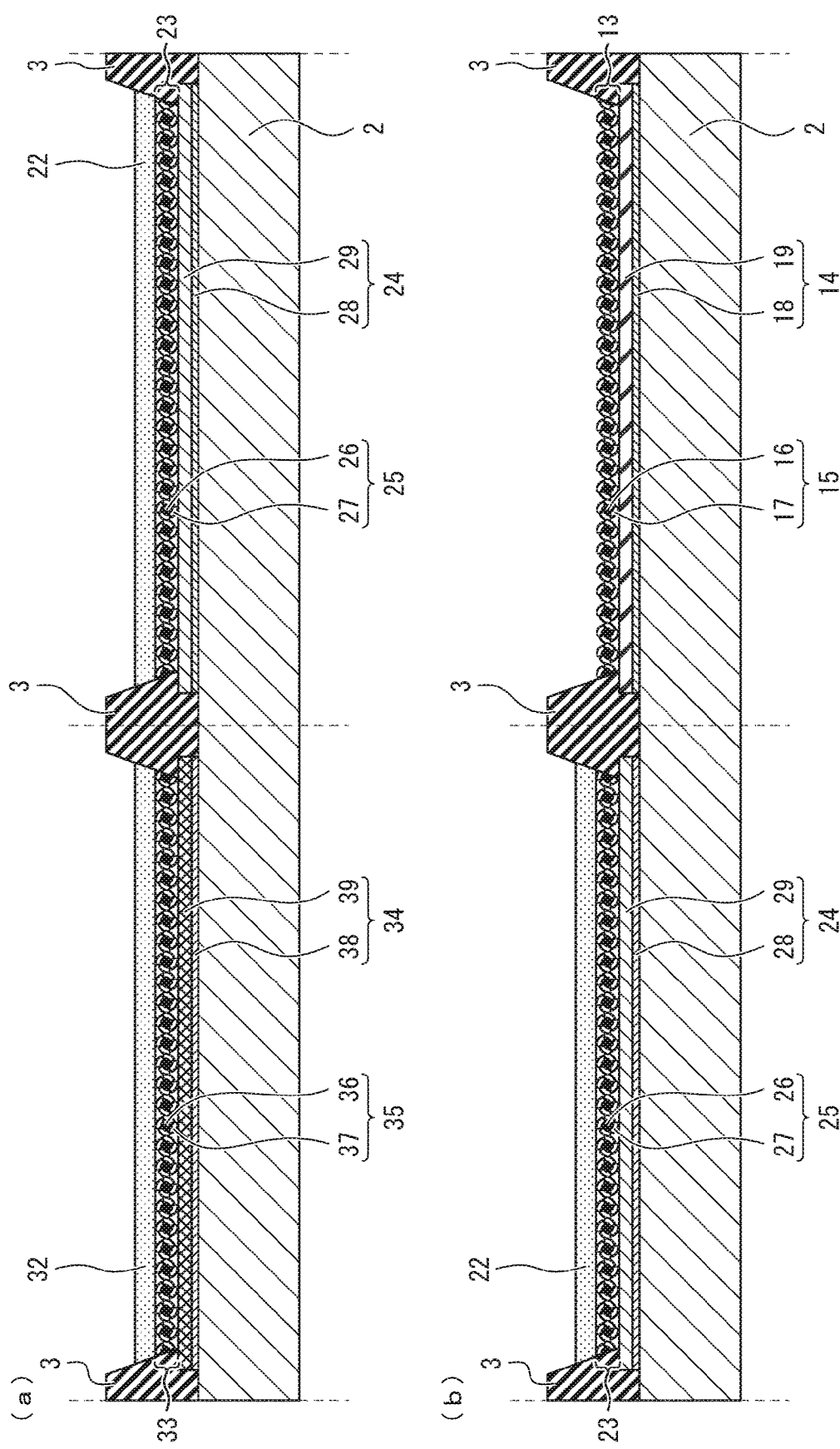
FIG. 23 is a cross-sectional view depicting the method of manufacturing a display device in accordance with Embodiment 3 of the disclosure.
Figure 24:
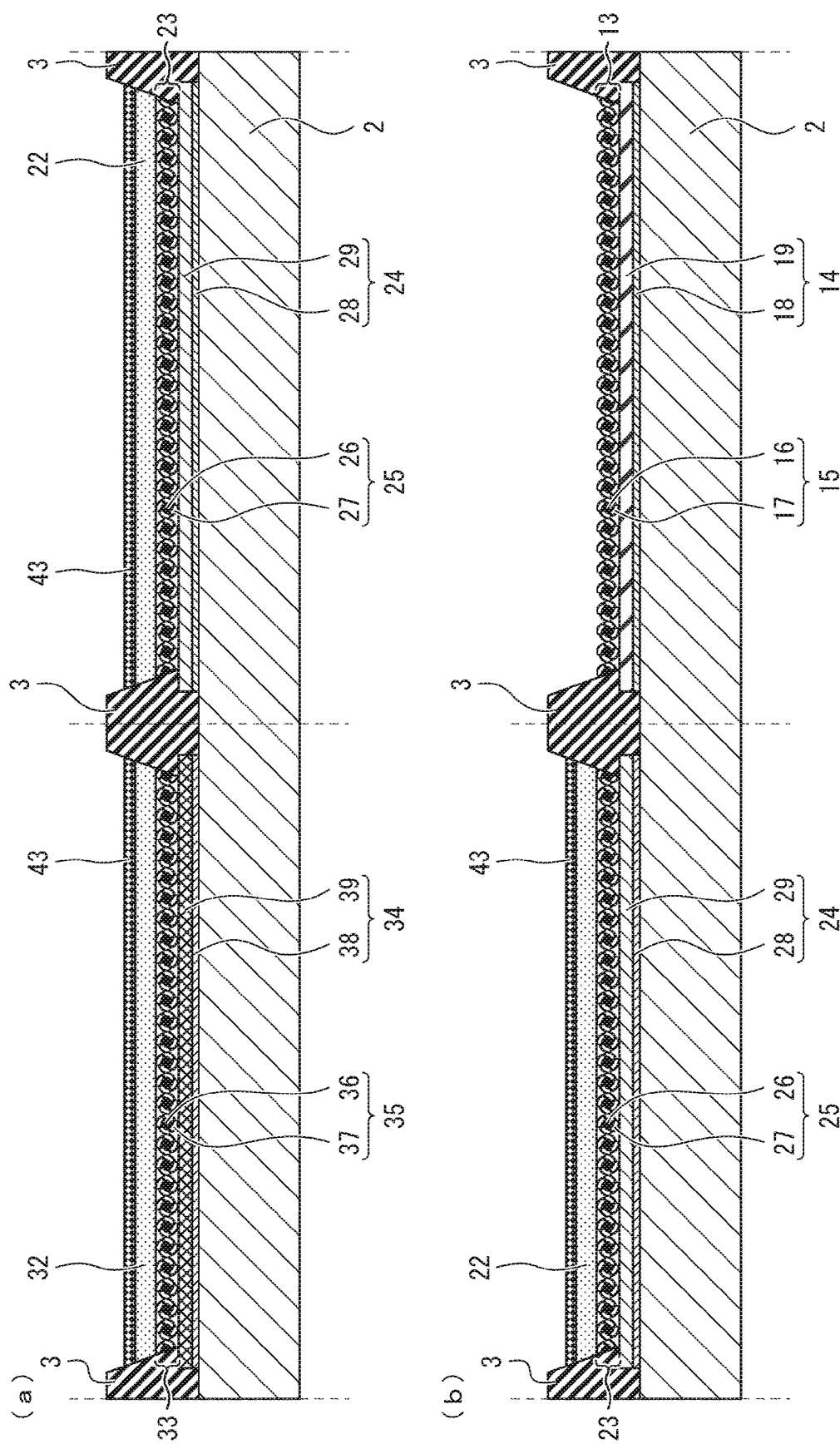
FIG. 24 is a cross-sectional view depicting the method of manufacturing a display device in accordance with Embodiment 3 of the disclosure.
Figure 25:
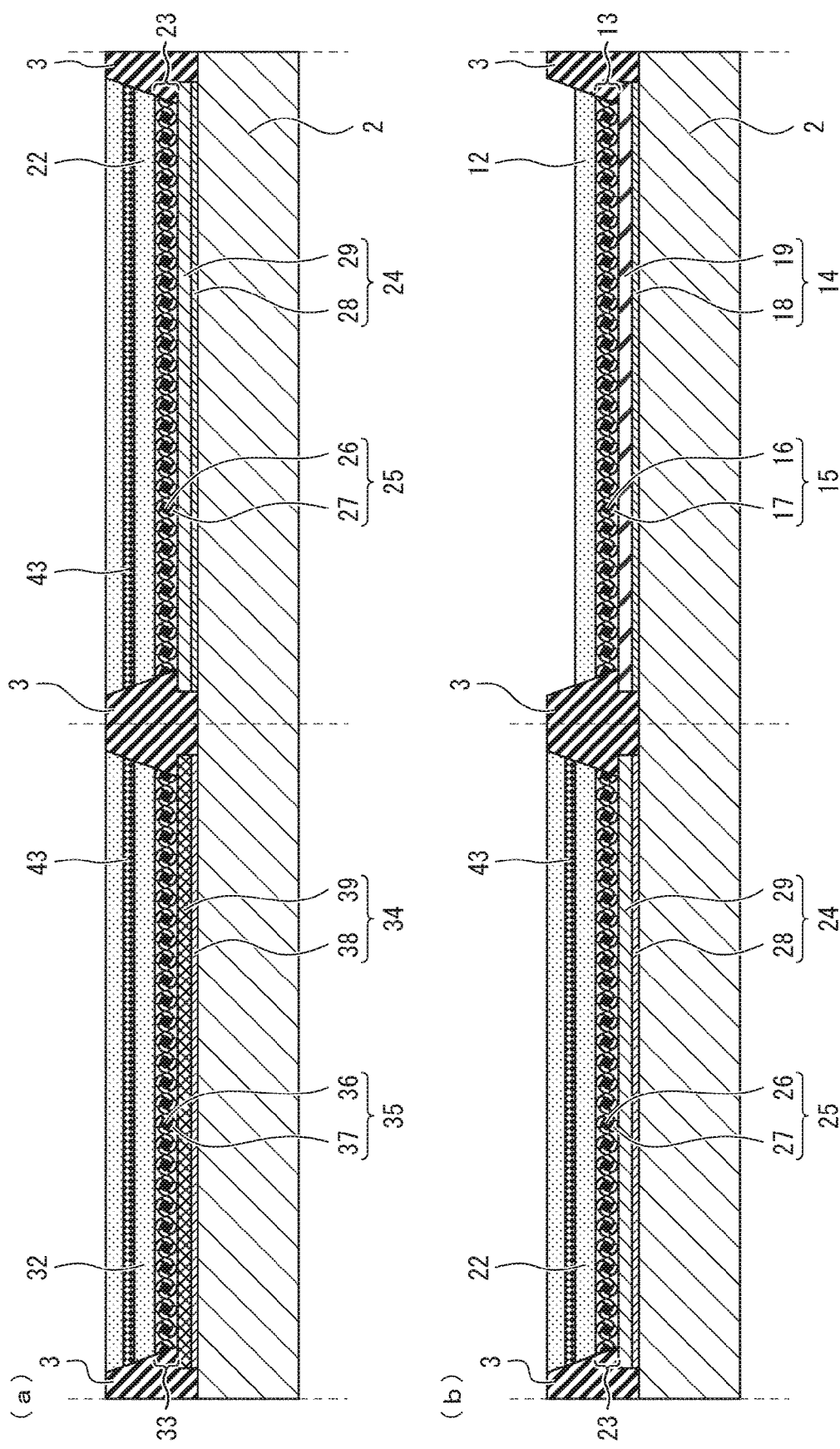
FIG. 25 is a cross-sectional view depicting the method of manufacturing a display device in accordance with Embodiment 3 of the disclosure.

Subsequently, the first light-emitting layer 13 is formed in the step shown in FIG. 23. Subsequently, photoresist 43 is provided on the second carrier transport layer 22 and the third carrier transport layer 32 in the step shown in FIG. 24. No photoresist 43 is provided on the first light-emitting layer 13. Subsequently, the first carrier transport layer 12 is stacked on the first light-emitting layer 13 in the step shown in FIG. 25. Subsequently, the photoresist 43 is lifted off in the step shown in FIG. 26.

Finally, the common electrode 1 is stacked on the first carrier transport layer 12, the second carrier transport layer 22, the third carrier transport layer 32, and the edge cover 3 as shown in FIGS. 14 and 15.

The present embodiment includes a first carrier transport layer forming step of forming the first carrier transport layer 12 on the first light-emitting layer 13 by lift-off. This particular technique can lower the risk of the first light-emitting layer 13 being contaminated with the second quantum dots 26 and the third quantum dots 36 in a later step, thereby improving the quality of the first light-emitting layer 13.

The present embodiment includes a second carrier transport layer forming step of forming the second carrier transport layer 22 on the second light-emitting layer 23 by lift-off. This particular technique can lower the risk of the second light-emitting layer 23 being contaminated with the third quantum dots 36 and the first quantum dots 16 in a later step, thereby improving the quality of the second light-emitting layer 23.

The present embodiment includes a third carrier transport layer forming step of forming the third carrier transport layer 32 on the third light-emitting layer 33 by lift-off. This particular technique can lower the risk of the third light-emitting layer 33 being contaminated with the first quantum dots 16 and the second quantum dots 26 in a later step, thereby improving the quality of the third light-emitting layer 33.

GENERAL DESCRIPTION

The disclosure, in aspect 1 thereof, is directed to a display device including: a first pixel electrode for a first pixel that emits first-color light; a second pixel electrode for a second pixel that emits second-color light having a different wavelength than the first-color light; a common electrode common to the first pixel and the second pixel; a first light-emitting layer between the first pixel electrode and the common electrode; and a second light-emitting layer between the second pixel electrode and the common electrode, wherein the first light-emitting layer includes: a first quantum dot; and ferritin encaging the first quantum dot and modified with a first peptide bound to the first pixel electrode, the second light-emitting layer includes: a second quantum dot; and ferritin encaging the second quantum dot and modified with a second peptide bound to the second pixel electrode, and the first pixel electrode has a surface made of a first metal material, and the second pixel electrode has a surface made of a second metal material of a different type than the first metal material.

The disclosure, in aspect 7 thereof, is directed to a method of manufacturing a display device, the method including: the electrode forming step of forming a first pixel electrode for a first pixel that emits first-color light and a second pixel electrode for a second pixel that emits second-color light having a different wavelength than the first-color light; the first light-emitting layer forming step of forming a first light-emitting layer on the first pixel electrode; and the second light-emitting layer forming step of forming a second light-emitting layer on the second pixel electrode, wherein the first pixel electrode is formed so as to have a surface made of a first metal material, and the second pixel electrode is formed so as to have a surface made of a second metal material of a different type than the first metal material, in the electrode forming step, the first metal material is bound to a first peptide modifying ferritin encaging a first quantum dot in the first light-emitting layer forming step, and the second metal material is bound to a second peptide modifying ferritin encaging a second quantum dot in the second light-emitting layer forming step.

These features enable the first quantum dot to be selectively positioned on the first pixel electrode in response to the electrostatic interaction between the first pixel electrode and the first peptide modifying the ferritin encaging the first quantum dot. That in turn eliminates the need to provide a partition wall for coating quantum dots with different materials around the first pixel electrode. This absence of the partition wall enables achieving a high aperture ratio and a high luminance with the display device.

The features also enable the second quantum dot to be selectively positioned on the second pixel electrode in response to the electrostatic interaction between the second pixel electrode and the second peptide modifying the ferritin encaging the second quantum dot. That in turn eliminates the need to provide a partition wall for coating quantum dots with different materials around the second pixel electrode. This absence of the partition wall enables achieving a high aperture ratio and a high luminance with the display device.

In addition, the first metal material and the second metal material are of different types, which enables preventing the first light-emitting layer and the second light-emitting layer from being contaminated with unwanted quantum dots.

In aspect 2 of the disclosure, the display device of aspect 1 is configured so as to further include: a third pixel electrode for a third pixel that emits third-color light having a different wavelength than both the first-color light and the second-color light; and a third light-emitting layer between the third pixel electrode and the common electrode, wherein the common electrode is common additionally to the third pixel, the third light-emitting layer includes: a third quantum dot; and ferritin encaging the third quantum dot and modified with a third peptide bound to the third pixel electrode, and the third pixel electrode has a surface made of a third metal material of a different type than both the first metal material and the second metal material.

These features enable the third quantum dot to be selectively positioned on the third pixel electrode in response to the electrostatic interaction between the third pixel electrode and the third peptide modifying the ferritin encaging the third quantum dot. That in turn eliminates the need to provide a partition wall for coating quantum dots with different materials around the third pixel electrode. This absence of the partition wall enables achieving a high aperture ratio and a high luminance with the display device.

In addition, the first metal material, the second metal material, and the third metal material are of mutually different types, which enables preventing the first light-emitting layer, the second light-emitting layer, and the third light-emitting layer from being contaminated with unwanted quantum dots.

In aspect 3 of the disclosure, the display device of aspect 2 is configured such that the first light-emitting layer emits blue light, and the first metal material contains Pt.

In aspect 4 of the disclosure, the display device of aspect 2 is configured such that the second light-emitting layer emits green light, and the second metal material contains Pd.

In aspect 5 of the disclosure, the display device of aspect 2 is configured such that the third light-emitting layer emits red light, and the third metal material contains Au.

In aspect 6 of the disclosure, the display device of aspect 1 is configured so as to further include: a first carrier transport layer between the first light-emitting layer and the common electrode; and a second carrier transport layer between the second light-emitting layer and the common electrode, wherein the first carrier transport layer and the second carrier transport layer are provided integrally.

In aspect 8 of the disclosure, the method of manufacturing a display device of aspect 7 is configured such that the first light-emitting layer forming step and the second light-emitting layer forming step are simultaneously performed.

This feature reduces the number of steps needed to form the first light-emitting layer and the second light-emitting layer, thereby improving productivity for the display device.

In aspect 9 of the disclosure, the method of manufacturing a display device of aspect 7 is configured such that a first solution containing the first quantum dot and the ferritin modified with the first peptide is applied to the first metal material in the first light-emitting layer forming step, and an excess amount of the first solution in terms of the formation of the first light-emitting layer is recovered after the first light-emitting layer forming step.

These features can lower the risk of the first solution having adverse effects in subsequent steps while reducing the cost related to the first solution.

In aspect 10 of the disclosure, the method of manufacturing a display device of aspect 7 is configured such that a second solution containing the second quantum dot and the ferritin modified with the second peptide is applied to the second metal material in the second light-emitting layer forming step, and an excess amount of the second solution in terms of the formation of the second light-emitting layer is recovered after the second light-emitting layer forming step.

These features can lower the risk of the second solution having adverse effects in subsequent steps while reducing the cost related to the second solution.

In aspect 11 of the disclosure, the method of manufacturing a display device of aspect 7 is configured so as to further include the carrier transport layer forming step of forming a carrier transport layer on either one of the first light-emitting layer and the second light-emitting layer by lift-off after either one of the first light-emitting layer forming step and the second light-emitting layer forming step, wherein the other one of the first light-emitting layer forming step and the second light-emitting layer forming step is performed after the carrier transport layer forming step.

These features can lower the risk of the first light-emitting layer being contaminated with the second quantum dots in a later step, thereby improving the quality of the first light-emitting layer. The features can alternatively lower the risk of the second light-emitting layer being contaminated with the first quantum dots in a later step, thereby improving the quality of the second light-emitting layer.

In aspect 12 of the disclosure, the method of manufacturing a display device of aspect 7 is configured so as to further include the edge cover forming step of forming an edge cover around the first pixel electrode.

This feature provides an edge cover, thereby preventing an electric field from concentrating between the first pixel electrode and the second pixel electrode.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A display device comprising:
a first pixel electrode for a first pixel that emits first-color light;
a second pixel electrode for a second pixel that emits second-color light having a different wavelength than the first-color light;
a common electrode common to the first pixel and the second pixel;
a first light-emitting layer between the first pixel electrode and the common electrode; and
a second light-emitting layer between the second pixel electrode and the common electrode, wherein
the first light-emitting layer includes:
a first quantum dot; and
ferritin encaging the first quantum dot and modified with a first peptide bound to the first pixel electrode,
the second light-emitting layer includes:
a second quantum dot; and
ferritin encaging the second quantum dot and modified with a second peptide bound to the second pixel electrode, and
the first pixel electrode has a surface made of a first metal material, and the second pixel electrode has a surface made of a second metal material of a different type than the first metal material.

2. The display device according to claim 1 further comprising:
a third pixel electrode for a third pixel that emits third-color light having a different wavelength than both the first-color light and the second-color light; and
a third light-emitting layer between the third pixel electrode and the common electrode, wherein
the common electrode is common additionally to the third pixel,
the third light-emitting layer includes:
a third quantum dot; and
ferritin encaging the third quantum dot and modified with a third peptide bound to the third pixel electrode, and
the third pixel electrode has a surface made of a third metal material of a different type than both the first meal material and the second metal material.

3. The display device according to claim 2, wherein
the first light-emitting layer emits blue light, and
the first metal material contains Pt.

4. The display device according to claim 2, wherein
the second light-emitting layer emits green light, and
the second metal material contains Pd.

5. The display device according to claim 2, wherein
the third light-emitting layer emits red light, and
the third metal material contains Au.

6. The display device according to claim 1 further comprising:
a first carrier transport layer between the first light-emitting layer and the common electrode; and
a second carrier transport layer between the second light-emitting layer and the common electrode, wherein
the first carrier transport layer and the second carrier transport layer are provided integrally.

7. A method of manufacturing a display device, the method comprising:
the electrode forming step of forming a first pixel electrode for a first pixel that emits first-color light and a second pixel electrode for a second pixel that emits second-color light having a different wavelength than the first-color light;
the first light-emitting layer forming step of forming a first light-emitting layer on the first pixel electrode; and
the second light-emitting layer forming step of forming a second light-emitting layer on the second pixel electrode, wherein
the first pixel electrode is formed so as to have a surface made of a first metal material, and the second pixel electrode is formed so as to have a surface made of a second metal material of a different type than the first metal material, in the electrode forming step,
the first metal material is hound to a first peptide modifying ferritin encaging a first quantum dot in the first light-emitting layer forming step, and
the second metal material is bound to a second peptide modifying ferritin encaging a second quantum dot in the second light-emitting layer forming step.

8. The method according to claim 7, wherein the first light-emitting layer forming step and the second light-emitting layer forming step are simultaneously performed.

9. The method according to claim 7, wherein
a first solution containing the first quantum dot and the ferritin modified with the first peptide is applied to the first metal material in the first light-emitting layer forming step, and
an excess amount of the first solution in terms of the formation of the first light-emitting layer is recovered after the first light-emitting layer forming step.

10. The method according to claim 7, wherein
a second solution containing the second quantum dot and the ferritin modified with the second peptide is applied to the second metal material in the second light-emitting layer forming step, and
an excess amount of the second solution in terms of the formation of the second light-emitting layer is recovered after the second light-emitting layer forming step.

11. The method according to claim 7 further comprising the carrier transport layer forming step of forming a carrier transport layer on either one of the first light-emitting layer and the second light-emitting layer by lift-off after either one of the first light-emitting layer forming step and the second light-emitting layer forming step, wherein
the other one of the first light-emitting layer forming step and the second light-emitting layer forming step is performed after the carrier transport layer forming step.

12. The method according to claim 7 further comprising the edge cover forming step of forming an edge cover around the first pixel electrode.

\* \* \* \* \*